(12) United States Patent
Ji et al.

(10) Patent No.: US 11,227,856 B2
(45) Date of Patent: Jan. 18, 2022

(54) MULTI-CHIP PACKAGE POWER MODULE

(71) Applicant: Delta Electronics (Shanghai) Co., Ltd., Shanghai (CN)

(72) Inventors: Pengkai Ji, Shanghai (CN); Xiaoni Xin, Shanghai (CN); Yan Chen, Shanghai (CN); Qingdong Chen, Shanghai (CN); Shouyu Hong, Shanghai (CN); Jianhong Zeng, Shanghai (CN); Zhenqing Zhao, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/735,716

(22) Filed: Jan. 7, 2020

(65) Prior Publication Data
US 2020/0219846 A1 Jul. 9, 2020

(30) Foreign Application Priority Data
Jan. 7, 2019 (CN) .......................... 201910013074.1

(51) Int. Cl.
*H01L 25/065* (2006.01)
*H01L 23/538* (2006.01)
(Continued)

(52) U.S. Cl.
CPC ...... *H01L 25/0655* (2013.01); *H01L 23/3121* (2013.01); *H01L 23/5222* (2013.01); *H01L 23/5227* (2013.01); *H01L 23/5384* (2013.01)

(58) Field of Classification Search
CPC ........... H01L 23/49827; H01L 23/3121; H01L 25/0657; H01L 25/0655
See application file for complete search history.

(56) References Cited

U.S. PATENT DOCUMENTS 6,627,984 B2  9/2003  Bruce et al.
6,806,580 B2  10/2004  Joshi et al.
(Continued)

FOREIGN PATENT DOCUMENTS

CN    101038880 A    9/2007
CN    101330075 A    12/2008
(Continued)

OTHER PUBLICATIONS

Machine translation of CN101378049 cited in IDS dated Jul. 13, 2021 (Year: 2007).*

(Continued)

*Primary Examiner* — Zandra V Smith
*Assistant Examiner* — John M Parker
(74) *Attorney, Agent, or Firm* — CKC & Partners Co., LLC

(57) ABSTRACT

A multi-chip package power module according to the present disclosure, comprising: multiple chips, including a first chip and a second chip that are arranged adjacently; a first conductive member, at least partially arranged between the first chip and the second chip, and a second conductive member, at least partially arranged between the first chip and the second chip, where the first conductive member is electrically connected to a power pin of the first chip, the second conductive member is electrically connected to a power pin of the second chip, and the multiple chips, the first conductive member and the second conductive member are all embedded in an insulating package material. For the multi-chip package power module according to the present disclosure, the power output current of the chip can be directly led out from two opposite sides through the conductive member to obtain a symmetrical path.

19 Claims, 18 Drawing Sheets

(51) Int. Cl.
  *H01L 23/522* (2006.01)
  *H01L 23/31* (2006.01)

(56) References Cited

U.S. PATENT DOCUMENTS

| | | | |
|---|---|---|---|
| 7,173,333 B2* | 2/2007 | Hata | H01L 23/49562 257/183 |
| 8,736,040 B2 | 5/2014 | Hauenstein et al. | |
| 2001/0007287 A1 | 7/2001 | Hoche | |
| 2005/0161785 A1* | 7/2005 | Kawashima | H01L 24/73 257/678 |
| 2006/0232942 A1 | 10/2006 | Nakatsu et al. | |
| 2010/0194511 A1 | 8/2010 | Kobayashi et al. | |
| 2011/0127678 A1 | 6/2011 | Shim et al. | |
| 2012/0014059 A1* | 1/2012 | Zeng | H01L 24/34 361/690 |
| 2012/0161128 A1* | 6/2012 | Macheiner | H01L 23/49562 257/48 |
| 2013/0049137 A1* | 2/2013 | Uno | H02M 1/32 257/401 |
| 2013/0094269 A1 | 4/2013 | Maeda et al. | |
| 2015/0055306 A1 | 2/2015 | Burns et al. | |
| 2015/0200050 A1 | 7/2015 | Nakao et al. | |
| 2016/0284789 A1 | 9/2016 | Zuo et al. | |
| 2017/0018348 A1 | 1/2017 | Mak et al. | |
| 2017/0062121 A1 | 3/2017 | Yang et al. | |
| 2017/0064808 A1 | 3/2017 | Rizza et al. | |
| 2017/0373133 A1 | 12/2017 | Liao | |
| 2018/0096780 A1 | 4/2018 | Sekiguchi et al. | |
| 2018/0102349 A1* | 4/2018 | Cho | H01L 23/49524 |
| 2018/0130595 A1 | 5/2018 | Choi et al. | |
| 2018/0182945 A1* | 6/2018 | Shimabukuro | H01L 33/62 |

FOREIGN PATENT DOCUMENTS

| | | |
|---|---|---|
| CN | 101378049 A | 3/2009 |
| CN | 101414602 A | 4/2009 |
| CN | 101790766 A | 7/2010 |
| CN | 101840769 A | 9/2010 |
| CN | 201655476 U | 11/2010 |
| CN | 102369790 A | 3/2012 |
| CN | 103298258 A | 9/2013 |
| CN | 103383891 A | 11/2013 |
| CN | 103730434 A | 4/2014 |
| CN | 104051363 A | 9/2014 |
| CN | 204348470 U | 5/2015 |
| CN | 104756611 A | 7/2015 |
| CN | 105679738 A | 6/2016 |
| CN | 107086212 A | 8/2017 |
| CN | 107919350 A | 4/2018 |
| CN | 108962773 A | 12/2018 |
| EP | 2482312 A2 | 8/2012 |
| JP | 2014168038 A | 9/2014 |
| KR | 970007127 B1 | 5/1997 |
| TW | 201537722 A | 10/2015 |

OTHER PUBLICATIONS

Corresponding Chinese office action dated May 31, 2021.
Corresponding Chinese office action dated Jun. 3, 2021.
Corresponding India office action dated Apr. 7, 2021.
Corresponding Chinese office action dated Jul. 21, 2021.
Corresponding India office action dated Aug. 31, 2021.
Corresponding India office action dated Oct. 25, 2021.

* cited by examiner

MULTI-CHIP PACKAGE POWER MODULE

CROSS-REFERENCE TO RELATED APPLICATIONS

The present application claims priority to Chinese application number 201910013074.1, filed on Jan. 7, 2019, which is incorporated by reference in its entirety.

TECHNICAL FIELD

The disclosure relates to a multi-chip package power module, which belongs to the field of electronic power technology.

BACKGROUND

With the increase of realizable functions of integrated circuits, power consumption thereof is also increasing, thereby requiring higher power density for the power modules or greater current output capability for a single power module. In the prior art, the multi-chip package is generally adopted to improve the current output capability for a single power module. However, in the existing multi-chip package mode, the lengths of paths through which the power current is transmitted to both sides of the chip are different, resulting in different impedances at the both sides, which seriously affects the current output capability for the power module.

SUMMARY

The present disclosure provides a multi-chip package power module to solve the above or other potential technical problems in the prior art.

According to some embodiments of the present disclosure, a multi-chip package power module is provided, including: multiple chips, including a first chip and a second chip that are arranged adjacently; a first conductive member, at least partially arranged between the first chip and the second chip; and a second conductive member, at least partially arranged between the first chip and the second chip, where the first conductive member is electrically connected to a power pin of the first chip, the second conductive member is electrically connected to a power pin of the second chip, and the multiple chips, the first conductive member and the second conductive member are all embedded in an insulating package material.

BRIEF DESCRIPTION OF THE DRAWINGS

The above and other objects, features and advantages of the embodiment of the present disclosure will become more easily understood by referring to the following detailed description of the attached drawings. In the attached drawings, various embodiments of the present disclosure will be illustrated by way of example and in a non-limiting manner, where:

FIG. 22 is a cross-sectional view of FIG. 21a;

DESCRIPTION OF EMBODIMENTS

Figure 1:
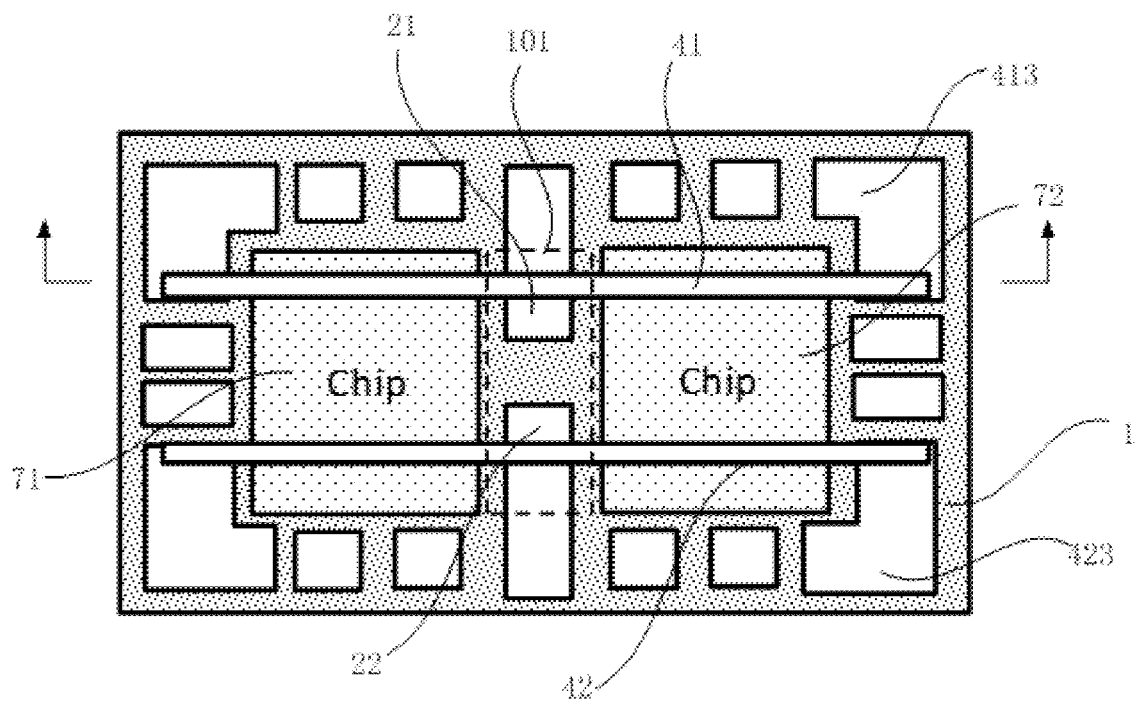
FIG. 1 is a schematic diagram of a multi-chip package power module according to an embodiment of the present disclosure.

The embodiments of the present disclosure are described in detail below, and examples of the embodiments are illustrated in the drawings, where the same or similar reference numerals are used to refer to the same or similar elements or elements having the same or similar functions. The embodiments described below with reference to the drawings are intended to be illustrative of the present disclosure and are not to be construed in a limiting sense.

In the description of the present disclosure, it is to be understood that terms "upper", "lower", "left", "right", "vertical", "horizontal", "inside", "outside", etc. indicate the orientation or the positional relationship shown in the drawings based on the orientation or positional relationship, and is intended only to facilitate the description of the present disclosure and simplify the description, and is not intended to indicate or imply that the referred apparatus or component has a specific orientation, and is constructed and operated in a specific orientation. Therefore, it should not be construed as limiting the present disclosure.

Moreover, the terms "first" and "second" are used for descriptive purposes only and are not to be construed as indicating or implying a relative importance or implicitly indicating the number of technical features indicated. Thus, features defined by "first" or "second" may include at least one of the features, either explicitly or implicitly. In the description of the present disclosure, the meaning of "a plurality" is at least two, such as two, three, etc., unless specifically defined otherwise.

In the description of the present specification, the description with reference to terms "one embodiment", "some embodiments", "example", "specific example", or "some examples" and the like means that a specific feature, structure, material or characteristic described in connection with the embodiment or example is included in at least one embodiment or example of the present disclosure. In the present specification, the schematic representation of the above terms is not necessarily directed to the same embodiment or example. Furthermore, the described particular feature, structure, material, or characteristic may be combined in a suitable manner in any one or more embodiments or examples. In addition, various embodiments or examples described in the present specification, as well as features of various embodiments or examples, may be combined by those skilled in the art, in the absence of contradiction.

With the development of technology, users demand for the quality and quantity of IC functions by users is growing, there are more and more devices on the motherboard, and the power consumption required is also increasing rapidly, thereby higher power density for the power modules of the power supply is required, or greater current output capability for a single power module is required. However, for the existing power modules packaged with multiple chips, the circuit loop is long and the impedance is large.

In view of this, the present embodiment provides a multi-chip package power module, which includes multiple chips, a first conductive member and a second conductive member embedded in an insulating package material. Where the multiple chips include a first chip and a second chip that are arranged adjacently, the first conductive member and the second conductive member are at least partially located between the first chip and the second chip, moreover, the first conductive member is electrically connected to a power pin of the first chip, and the second conductive member is electrically connected to a power pin of the second chip. In the multi-chip package power module of the present embodiment, by arranging the first conductive member and the second conductive member between the adjacent first and second chips, and electrically connecting the first conductive member and the second conductive member to the first chip and the second chip respectively, the first conductive member and the second conductive member may provide a conductive path which has small circuit parasitic parameters, is generally consistent (i.e., has a symmetric circuit) and is multiplexed, to the first chip and the second chip, the first conductive member and the second conductive member may respectively shunt the current output by the first chip and the second chip, facilitating reduction of the circuit impedance, improvement of the efficiency and the current output capability. Moreover, such layout is beneficial to improving the symmetry of the circuit, thereby reducing the parasitic inductance of the circuit, further improving the efficiency and the current density. In addition, the current passes through the first conductive member and the second conductive member in the vertical direction, which is advantageous for forming a stacked structure to improve the power density of the power supply module and is also advantageous for heat dissipation.

In order to enable those skilled in the art to more intuitively understand the technical solution of the present embodiment, several optional multi-chip package power modules are described below in conjunction with the attached drawings, but it should be understood that the following specific embodiments are not intended to specifically limit the present disclosure, the technical features in each of the following embodiments can be used alone or in combination without departing from the inventive concept, the technical features in different embodiments can also be used in combination, and all technical features in each embodiment cannot be regarded as essential technical features.

Figure 2:
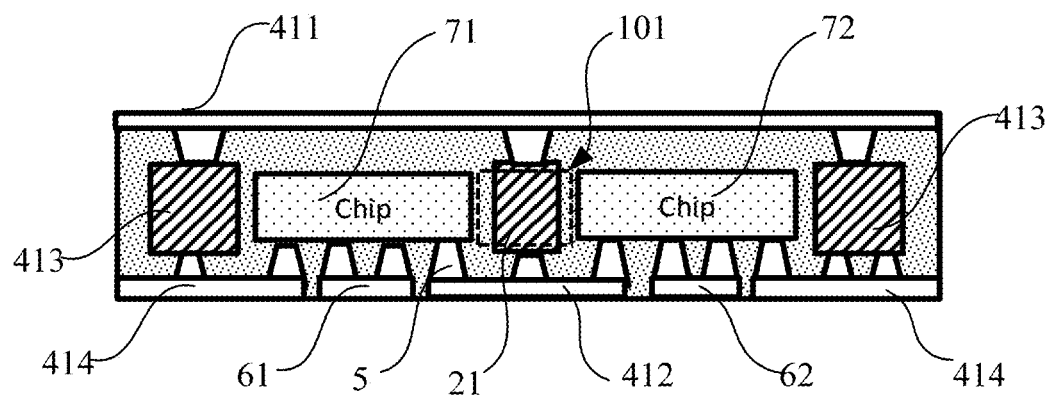
FIG. 2 is a cross-sectional view of FIG. 1.

FIG. 1 is a schematic structural diagram of a multi-chip package power module provided in the present example, and FIG. 2 is a cross-sectional view of FIG. 1. As shown in FIG. 1 and FIG. 2, the multi-chip package power module (hereinafter referred to as "package module") provided in the present example has two chips arranged in parallel in the insulating package material 1, that is, the first chip 71 and the second chip 72, which can be arranged at the same layer or at the staggered layer. One or more switches (such as MOSFET or transistor) are integrated in each chip to form various circuits including the circuit shown in FIG. 27, thereby realizing different outputs. For example, in some optional examples, at least two switches can be integrated in each chip. Optionally, two switches can be connected in series to obtain a half-bridge circuit. The envelope region between the two chips is arranged with the first conductive member 21 and the second conductive member 22, the first conductive member 21 is at least electrically connected to a power pin (terminal) of one of the chips, the second conductive member 22 is at least electrically connected to a power pin of the other chip, and the second conductive member 22 and the first conductive member 21 have different electrical characteristics.

It should be noted first that, in the present example and other examples below, the region between the two chips refers to the space region between the chips within the smallest envelope hexahedron of the two chips (hereinafter referred to as "envelope region 101"), as shown by the dashed lines in FIG. 1 and FIG. 2. It should be understood that in the present example, the first conductive member 21 can be wholly or partially located in the envelope region 101. Similarly, the second conductive member 22 can also be wholly or partially located in the envelope region 101. In addition, the case referred to in the present example and hereinafter that the first conductive member 21 and the second conductive member 22 have different electrical characteristics means that the polarity, waveform or phase, etc. of current flowing through the first conductive member 21 and the second conductive member 22 are different, or may be different voltage, current or impedance characteristics, etc. For example, when the first conductive member 21 is a positive electrode (for example, it is electrically connected to Vin), the second conductive member 22 can be a negative electrode (for example, it is electrically connected to GND).

Optionally, the package module further includes a first conductive line 41 and a second conductive line 42, where the first conductive member 21 is electrically connected to the first conductive line 41 in a direction perpendicular to the chips, the second conductive member 22 is electrically connected to the second conductive line 42 in a direction perpendicular to the chips. The first conductive line 41 and the second conductive line 42 can be directly used as input and output pins of the package module or electrically connected to other devices in the package module, for example, they can be electrically connected to the conductive body arranged around the chips.

Taking FIG. 2 as an example, the first conductive line 41 includes a first lead 411 on the top and a first connection line 412 at the bottom. Similarly, the second conductive line 42 can include a second lead on the top and a second connection line at the bottom (not shown in FIG. 2). Of course, in other examples, positions of the first lead 411 and the first connection line 412 can also be opposite to the direction shown in FIG. 2, that is, the first lead 411 is at the bottom and the first connection line 412 is on the top. Similarly, the positions of the second lead and the second connection line can also be opposite to that shown in FIG. 2. In addition, in some examples, the first lead 411 and the second lead cannot be on the same side of the chips, for example, the first lead 411 and the second lead can be respectively arranged on the top and at the bottom that are shown in FIG. 2.

Optionally, in some examples, the first conductive line 41 and the first conductive member 21 can be formed together. Similarly, the second conductive line 42 and the second conductive member 22 can be formed together. Of course, in the present example, the specific structures of the first conductive line 41 and the second conductive line 42 are not limited, and those skilled in the art can design the circuits as required.

Further taking FIG. 2 as an example, in some examples, it is assumed that the first chip 71 and the second chip 72 are both planar power electronic devices, and the electrical connection is led out in a flip-chip manner at the same time, that is, pins of the chip are at the bottom, and is electrically connected to the lower connection line through the conductive via 5, the lower connection line is electrically connected to the conductive member through the conductive via 5, then the conductive member is electrically connected to the upper lead through the upper conductive via 5, and the upper lead is led out to both the left and right sides respectively.

Specifically, the upper end of the first conductive member 21 is electrically connected to the upper first lead 411 through the conductive via 5, and the lower end thereof is electrically connected to the lower first connection line 412 through the conductive via 5, and the first connection line 412 is electrically connected to the first chip 71 and/or the second chip 72 through the conductive via 5. For example, in some examples, the first connection line 412 can be electrically connected only to the first power pin of the first chip 71, in other examples, the first connection line 412 can be electrically connected to both the first power pin of the first chip 71 and the first power pin of the second chip 72 at the same time. Of course, in other examples, the first connection line 412 can be electrically connected to both the first power pin of the first chip 71 and the second power pin of the second chip 72 at the same time.

Similarly, the upper end of the second conductive member 22 is electrically connected to the upper second lead through the conductive via 5, and the lower end thereof is electrically connected to the lower second connection line through the conductive via 5, and the second connection line is electrically connected to the first chip 71 and/or the second chip 72 through the conductive via 5. For example, in some examples, the second connection line can be electrically connected only to the second power pin of the second chip 72; while in other examples, the second connection line can be electrically connected to both the second power pin of the first chip 71 and the second power pin of the second chip 72 at the same time. Of course, in other examples, the second connection line can be electrically connected to both the first power pin of the first chip 71 and the second power pin of the second chip 72 at the same time.

Please continue to refer to FIG. 1 and FIG. 2, the first conductive line 41 can include multiple first conductive bodies 413 arranged at a position near the edge of the package module (i.e., outside the rectangular region formed by the first chip 71 and the second chip 72). Similarly, the second conductive line 42 can include multiple second conductive bodies 423 arranged at a position near the edge of the package module. The first conductive body 413 and the second conductive body 423 can be metal lead frames, conductive vias 5, or metal blocks, and of course can be various suitable structural forms such as an embedded PCB board. In the present example, structures of the first conductive body 413 and the second conductive body 423 can be the same or different, for example, when one is a metal lead frame, the other can be a metal lead frame or a conductive via 5. It should be noted that other conductive bodies can be formed in the envelope region 101 between chips for transmitting signal current.

As shown in FIG. 2, the left end of the first lead 411 is electrically connected to the first conductive body 413 on the left side, and the right end of the first lead 411 is electrically connected to the first conductive body 413 on the right side. Similarly, as shown in FIG. 1, the left end of the second lead is electrically connected to the second conductive body 423 on the left side, and the right end of the second lead is electrically connected to the second conductive body 423 on the right side.

Further, as shown in FIG. 2, the first conductive line 41 can further include a third connection line 414, and the second conductive line 42 can further include a fourth connection line 424 (not shown). Specifically, in some examples, the first conductive line 41 includes the third connection line 414 on the left side and the third connection line 414 on the right side, where the third connection line 414 on the left side is electrically connected to the first conductive body 413 and the first chip 71 that are both on the left side, and the third connection line 414 on the right side is electrically connected to the first conductive body 413 and the second chip 72 that are both on the right side. Similarly, the second conductive line 42 can also include a fourth connection line 424 on the left side and a fourth connection line 424 on the right side, where the fourth connection line 424 on the left side is electrically connected to the second conductive body 423 and the first chip 71 that are both on the left side, and the fourth connection line 424 on the right side is electrically connected to the second conductive body 423 and the second chip 72 that are both on the right side. Of course, in the present example, the third connection line 414 on the left side and the third connection line 414 on the right side can be electrically connected to the same power pin with the same function of the first chip 71 and the second chip 72, respectively, or can be electrically connected to different power pins with different functions. Similarly, the same is true for the fourth connection line on the left side and the fourth connection line on the right side.

It should be understood that the first conductive line 41 and the second conductive line 42 can also be used as circuit pins for the entire package module or can be electrically connected to the circuit pins. Taking the first conductive line 41 as an example, any one or more of the first lead 411, the first conductive body 413, the first connection line 412, and the third connection line 414 can be used as a circuit pin or electrically connected to the circuit pin. Moreover, in the present example, each portion of the first conductive line 41 and the second conductive line 42 (including but not limited to the first lead 411, the first conductive member 21, the first connection line 412, the third connection line 414, the second lead 421, the second conductive member 22, the second connection line 422, the fourth connection line 424, etc.) can be a conductive via or a metal wiring layer (or routing layer, or copper trace) formed by metallization. For example, the first conductive member 21 or the second conductive member 22 can be manufactured by a lead frame manner, or by arranging a copper block or the like, and can also be manufactured by metallization such as manufacturing a via in the insulating package material 1 and then electroplating, or any other manner of forming a conductive member in the envelope region 101 between chips.

In addition, in case that multiple switches are arranged in the first chip 71 or in the second chip 72, the chip may have more power pins, for example, have a third power pin. As shown in FIG. 1 and FIG. 2, the first pad 61 electrically connected to the third power pin of the first chip 71 is optionally formed on the first chip 71, the second pad 62 electrically connected to the third power pin of the second chip 72 is also optionally formed on the second chip 72, such pad can be used to SMT and solder or stacking other electronic components, such as capacitors or inductors. Of course, in the present example, it is not necessary to simultaneously form the first pad 61 and the second pad 62 on both chips.

The multi-chip power package module provided by the present example, can simultaneously lead out the external power current of each chip along the left and right sides of FIG. 1 or FIG. 2, that is, the current split-flowing path of each chip, thereby facilitating reduction of the circuit impedance, improvement of the efficiency and the current output capability; at the same time, upon reasonable layout of the first conductive line 41 and the second conductive line 42, the symmetry of the circuit can be improved, thereby reducing the parasitic inductance of the circuit, so as to improve the current sharing effect of the multi-phase circuit, and further improving the efficiency and the current density. In addition, since each of the first conductive member 21 and the second conductive member 22 is at least partially penetrated in the envelope region 101 of the first chip 71 and the second chip 72, the power current is enabled to flow in the vertical direction in the entire structure, which facilitates the formation of a stacked structure and the improvement of the power density of the module, and in some examples, the circuit pins can also lead out on both sides, thereby facilitating the heat dissipation from both sides of the package module.

Figure 3:
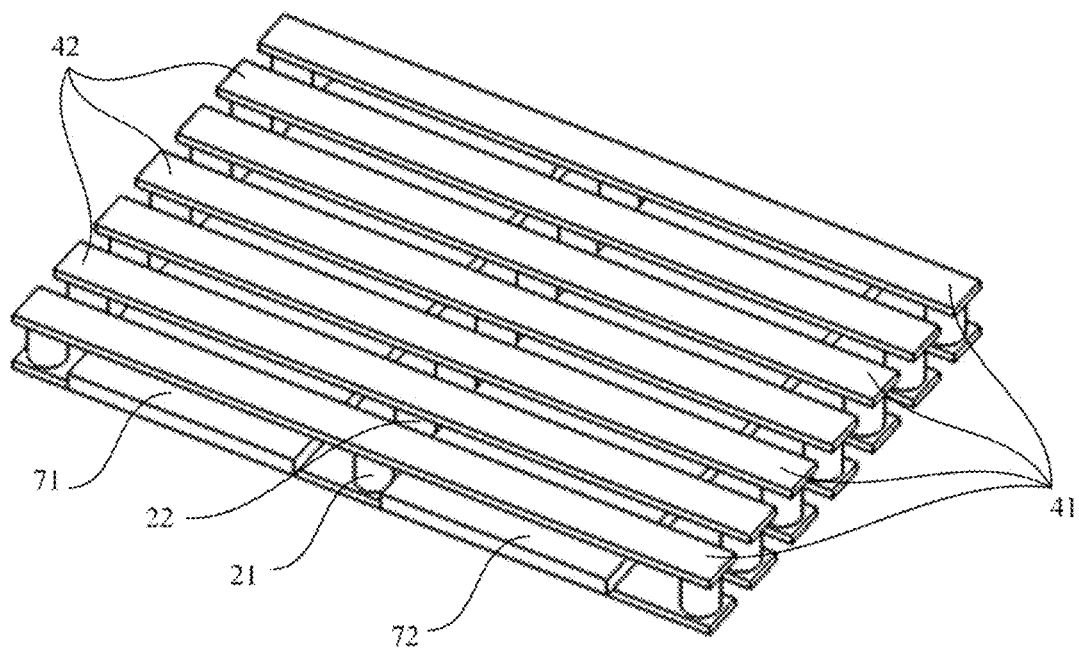
FIG. 3 is a perspective structural schematic diagram of FIG. 1, in which the insulating package material and the conductive via between the conductive line and the chip are omitted.
Figure 27A:
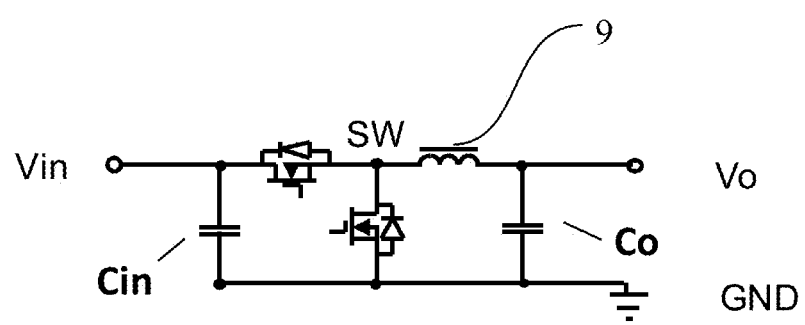
FIG. 27a to FIG. 27g are schematic structural diagrams of several optional circuits according to some embodiments of the present disclosure.

FIG. 3 is a perspective structural schematic diagram of FIG. 1, in which the insulating package material 1 and the conductive via 5 between the conductive line and the chip are omitted. As shown in FIG. 3, multiple first conductive members 21 and second conductive members 22 can be alternately arranged between the first chip 71 and the second chip 72, correspondingly, multiple first conductive lines 41 electrically connected to the first conductive member 21 and multiple second conductive lines 42 electrically connected to the second conductive member 22 can be alternately arranged. Taking the buck circuit shown in FIG. 27a as an example, where Cin represents the input capacitor, Co represents the output capacitor, Vin represents the positive input of the half-bridge circuit, GND represents the negative input of the half-bridge circuit, and Vo represents the positive output of the half-bridge circuit. In FIG. 3, both the first chip 71 and the second chip 72 include two switches connected in series as shown in FIG. 27a, the first conductive member 21 corresponds to the electrode Vin in FIG. 27a, the second conductive member 22 corresponds to the electrode GND, so the arrangement shown in FIG. 3 allows Vin and GND alternate with and close to each other, which can further reduce the parasitic inductance of the loop and facilitate the improvement of the operating frequency and efficiency of the chip. Moreover, Vin and GND between the chips can be connected with each other at a very short distance, thereby facilitating the improvement of the current sharing effect between the two-phase circuits.

Figure 4:
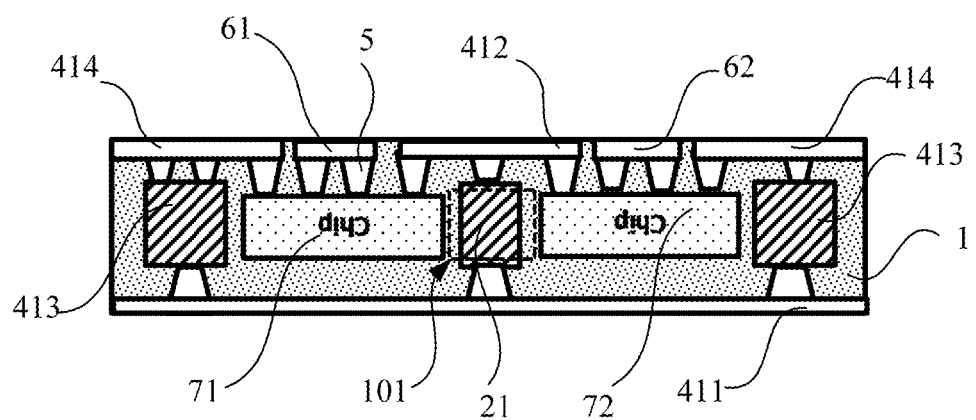
FIG. 4 is a schematic structural diagram of another multi-chip package power module according to an embodiment of the present disclosure.

FIG. 4 is a schematic structural diagram of another multi-chip package power module. Different from FIG. 2, the pins of the chip are adjusted from the bottom to the top in the figure. Specifically, the pins of each chip are electrically connected to the corresponding first connection line 412 and the corresponding second connection line 422 through the conductive via 5, the first connecting line 412 and the second connecting line 422 are electrically connected to the corresponding leads under the chip through the corresponding conductive member and conductive body, and the leads can also be used as pins under the package module or the leads can be used to electrically connect with pins under the package module. The connection line above the chip connect the power electrodes of the same electrical characteristics pins of two chips with very short path so as to facilitate current sharing between the two chips. In addition, in combination with the circuit shown in FIG. 27a, the SW electrode can also be led out above the chip in FIG. 4, that is, the first pad 61 and the second pad 62. The first pad 61 and the second pad 62 are respectively electrically connected to the SW electrode pins of the chip through the conductive via 5, so as to shorten the connection path, thereby reducing the impedance, improving the efficiency, and making the structure compact. In some examples, pins can also be led out on both sides of the chip, thereby facilitating the realization of a stacked structure and the improvement of the power density of the power supply module.

Figure 5:
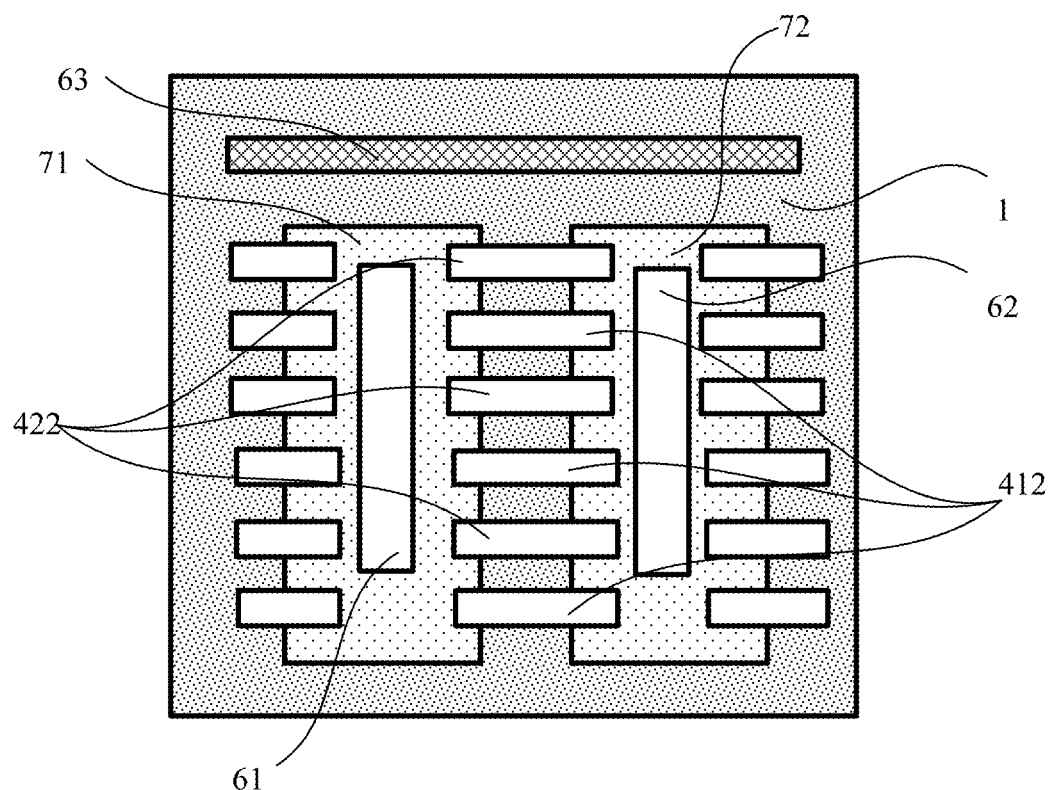
FIG. 5 is a top view of FIG. 4, showing a pin layout on the top.
Figure 6:
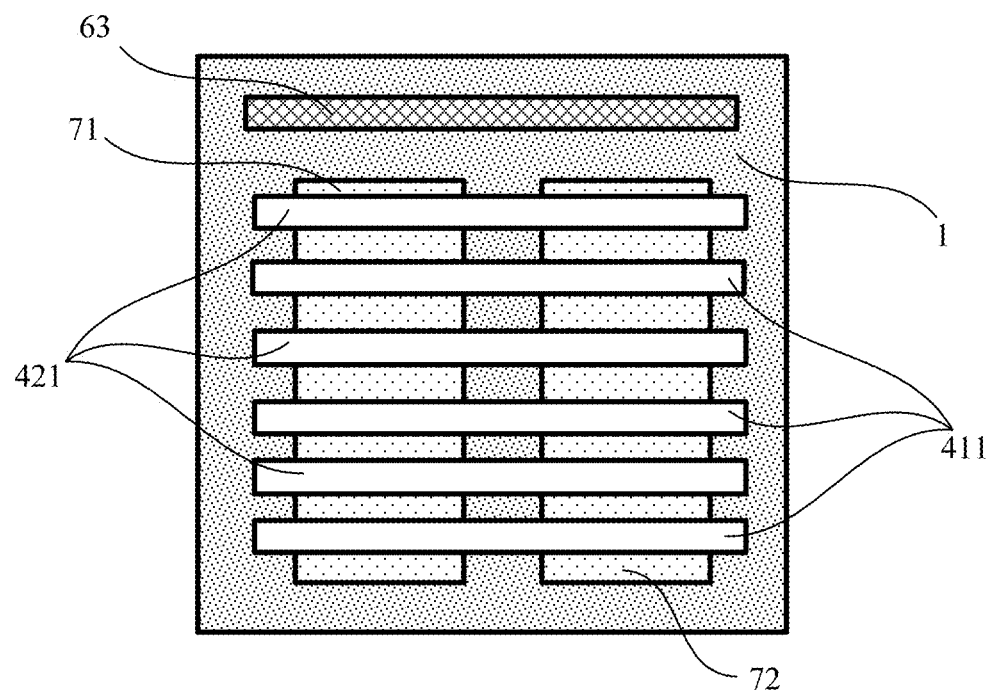
FIG. 6 is a bottom view of FIG. 4, showing a pin layout at the bottom.
Figure 7:
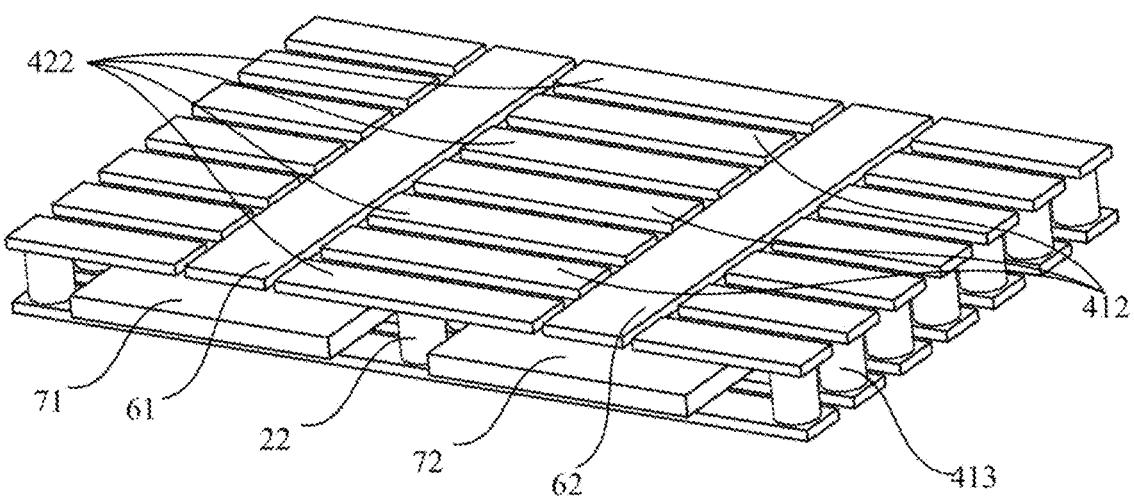
FIG. 7 is a perspective structural schematic diagram of FIG. 4, in which the insulating package material and the conductive via between the conductive line and the chip are omitted.

FIG. 5 is a top view of FIG. 4, showing a pin layout on the top, FIG. 6 is a bottom view of FIG. 4, showing a pin layout at the bottom, and FIG. 7 is a perspective structural schematic diagram of FIG. 4, in which the insulating package material 1 and the conductive via 5 from the conductive line to the chip are omitted. Taking the circuit of FIG. 27a as an example, assuming that in FIG. 5 and FIG. 6, the first chip 71 has two switches connected in series, and the second chip 72 has two switches connected in series, the first pad 61 is set to the electrode SW1 and the second pad 62 is set to the electrode SW2, then the SW1 and the SW2 can be directly connected to the corresponding inductors, such as two opposite coupling inductors. The output pad 63 is reserved, for example, it can connect the output end of the inductor 9 to form the Vo pin of the entire power supply module. The first connection line 412 electrically connects with the first power pin of the chip 71 and the chip 72, as the Vin end, and the second connection line 422 electrically connects with the second power pin of the chip 71 and the chip 72, as the GND end. Thus, Vin and GND are arranged close to each other and alternate with, which facilitates the reduction of the parasitic inductance of the loop.

FIG. 7 shows the arrangement of pads and conductive lines on the top and at the bottom of the chip as a whole. Different from FIG. 3, the pin side of the chip is arranged upward, and the first pad 61 and the second pad 62 are led out from the upper surface as pins SW. The first connection line 412 and the second connection line 422 arranged alternately are pin Vin and pin GND respectively, which connect the Vin pin and the GND pin respectively of the two chips with very short path, and can also be simultaneously led out on both the left and right sides of each chip through the first lead 411 and the second lead 421 respectively. Through the above arrangement, the input and output current paths after the two circuits shown in FIG. 27*a* are connected in parallel are short, the symmetry of the two-phase circuit is good, the coupling effect of the input circuit is good, the current sharing is good, the impedance is small, upward heat dissipation and downward heat dissipation can be realized at the same time, and the stacked power supply module can be realized easily.

Figure 8:
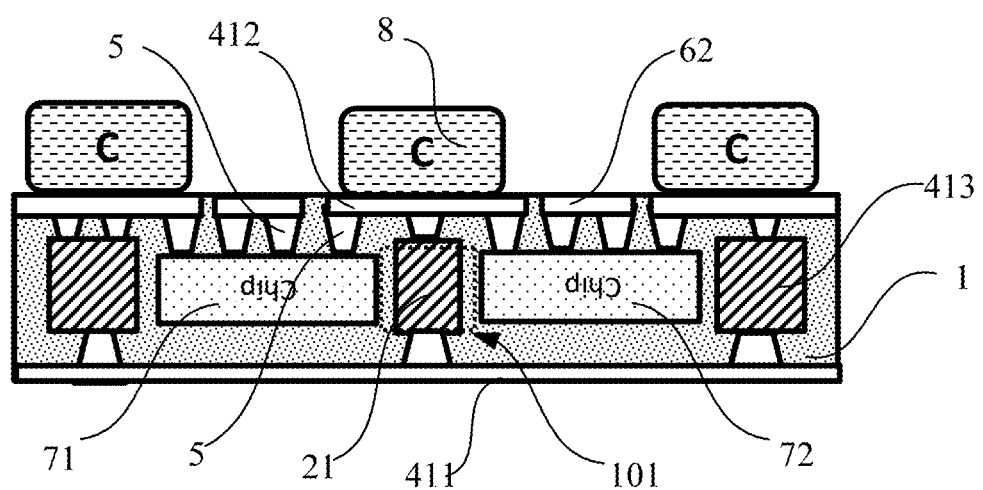
FIG. 8 adds a capacitor 8 on the basis of FIG. 4.
Figure 9:
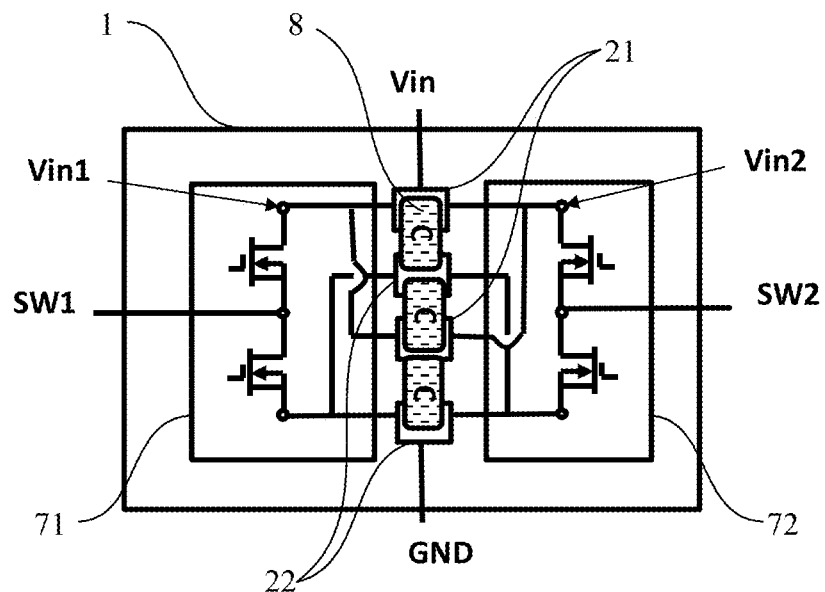
FIG. 9 is a top view of FIG. 8, and a simplified circuit structure is represented by FIG. 9.

FIG. 8 adds a capacitor 8 on the basis of FIG. 4, and FIG. 9 is a schematic diagram of the electrical connection of the top view of FIG. 8, and a simplified circuit structure is represented by FIG. 9. As shown in FIG. 8 and FIG. 9, assuming that the two circuits in FIG. 27*a* are connected in parallel, the capacitor 8 is the input capacitor Cin in the circuit in FIG. 27*a*. Continue to refer to FIG. 8, the input capacitor 8 is electrically connected to the pad formed by the first connection line 412 and the second connection line 422, and then respectively electrically connected to the corresponding pin of the chip, the first conductive member 21 and the second conductive member 22 through the conductive via 5, and the lower ends of the first conductive member 21 and the second conductive member 22 are respectively electrically connected to the first lead 411 and the second lead 421 through the conductive via 5, or the lower ends of the first conductive member 21 and the second conductive member 22 form output electrical pins of the module. Specifically, further referring to FIG. 5, the two pins of the input capacitor 8 can be electrically connected to the pins shown in FIG. 5, respectively, and the pins in FIG. 5 correspond to the first connection line 412 and the second connection line 422 in FIG. 8, respectively.

Referring to FIG. 9, the capacitor 8 is electrically connected to the first conductive member 21 and the second conductive member 22, respectively, the first conductive member 21 and the second conductive member 22 are respectively electrically connected to the input ends Vin and GND of the entire module, where Vin represents the positive input of the entire package module, GND represents the negative input of the entire package module, Vin1 represents the positive input of the first chip 71, Vin2 represents the positive input of the second chip 72, SW1 represents the SW pin of the first chip 71 and SW2 represents the SW pin of the second chip 72.

Figure 10:
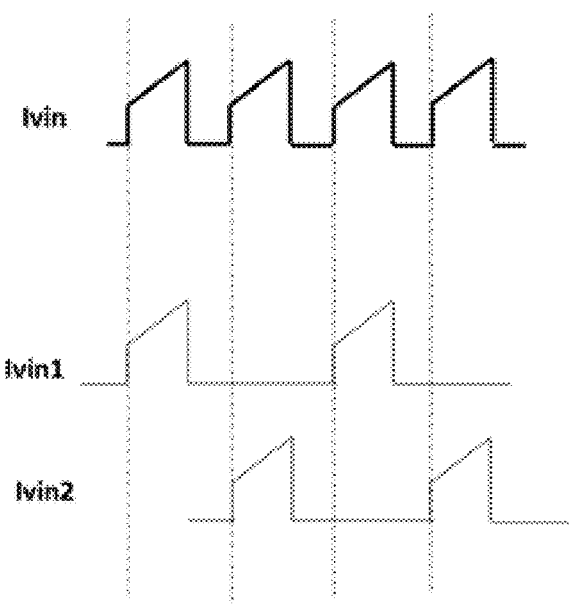
FIG. 10 is a waveform diagram of the two-phase circuit of FIG. 9.

FIG. 10 is a waveform diagram of the two-phase circuit of FIG. 9; specifically, FIG. 10 illustrates the current waveforms on the input capacitor 8, Vin1 and Vin2 in FIG. 9. Where Ivin represents the current waveform on the input capacitor 8 in FIG. 9, Ivin1 represents the current waveform at the Vin1 electrode, and Ivin2 represents the current waveform at the Vin2 electrode. It can be seen that the frequency of the current waveform of Ivin is the sum of the frequencies of Ivin1 and Ivin2. That is, the frequency of the current on the capacitor 8 is higher than the frequency of the current waveform at the input point of each phase circuit or chip, which facilitates the reduction of the ripple on the capacitor 8 and the improvement of the efficiency. In addition, the multi-chip package power module shown in FIG. 8 can make the path from Vin to Vin1 and Vin2 as short as possible, that is, the path of Ivin ripple state in the input circuit is as short as possible, thereby reducing the parasitic inductance of the circuit, and the circuits from Vin to Vin1 and Vin2 can be symmetrically arranged, thus the ripple of the input circuit is reduced as a whole, which further improves the efficiency. Moreover, as can be seen from FIG. 5, FIG. 8 and FIG. 9, in some examples, the input capacitor 8 can be arranged at a symmetrical position between the two chips, electrical connection thereof can be performed through the first conductive member 21 and the second conductive member 22 arranged in the envelope region 101 of the two chips, thereby realizing short and symmetrical circuit path between the input capacitor 8 and the two chips; when the two-phase circuit interleaving, current sharing, mutual coupling and ripple cancellation can be further realized, thereby improving the efficiency and the operating frequency. Such arrangement also facilitates the reduction of the capacity of the input capacitor Cin, the number of capacitors, the module volume and the cost.

Figure 11:
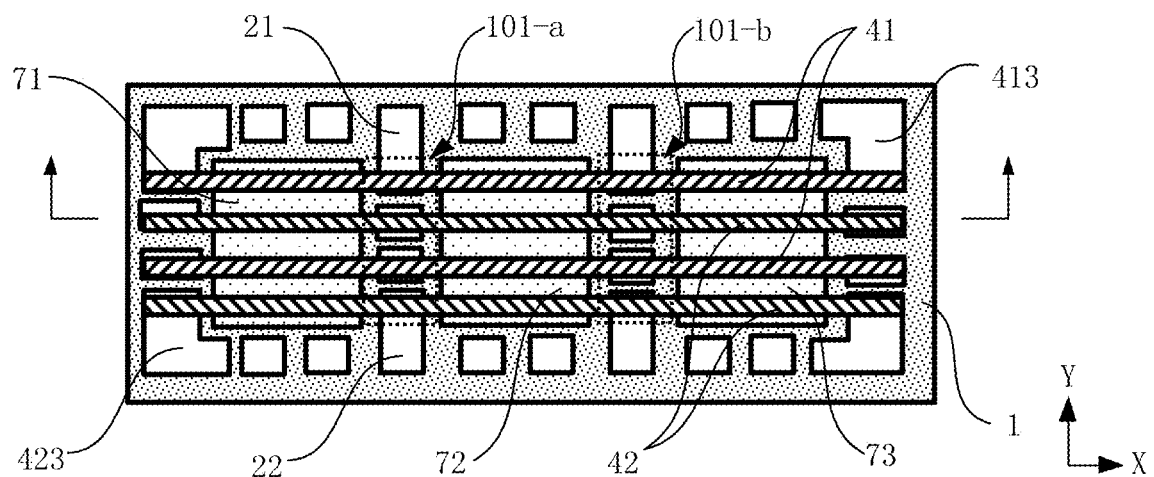
FIG. 11 is a schematic structural diagram of yet another multi-chip package power module according to an embodiment of the present disclosure, in which three chips are linearly arranged in the X direction in the figure.
Figure 12:
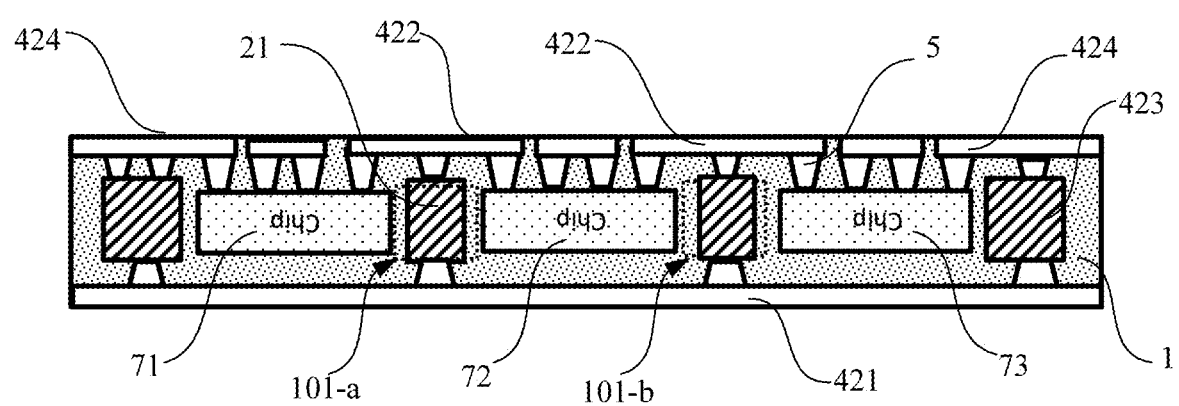
FIG. 12 is a cross-sectional view of FIG. 11.

FIG. 11 is a schematic structural diagram of yet another multi-chip package power module, in which three chips are linearly arranged in the X direction in the figure, and FIG. 12 is a cross-sectional view of FIG. 11. As shown in FIG. 11 and FIG. 12, a first conductive member 21 and a second conductive member 22 can be arranged in the envelope region 101 between two adjacent chips. Optionally, the first conductive member 21 located in the envelope region 101-*a* and the first conductive member 21 located in the envelope region 101-*b* can be connected with each other through the first conductive line 41 in FIG. 11, and the first conductive line 41 is electrically connected to the chip through the conductive via 5. Similarly, in FIG. 11, the second conductive member 22 located in the envelope region 101-*a* and the second conductive member 22 located in the envelope region 101-*b* can be short-circuited with each other through the second conductive line 42, and the second conductive line 42 is electrically connected to the chip through the conductive via 5. Of course, although FIG. 11 illustrates three chips arranged in the X direction, in other examples, there may be more than three chips being linearly arranged in the X direction.

In addition, in the present example, the envelope region 101 between two adjacent chips can have only one first conductive member 21 and one second conductive member 22, or can have multiple first conductive members 21 and multiple second conductive members 22 arranged alternately. Moreover, in some examples, it is not necessary to provide the first conductive member 21 and the second conductive member 22 in the envelope region 101 between all adjacent two chips. At the same time, in the present example, the first conductive line 41 connected to the first conductive member 21 and the second conductive line 42 connected to the second conductive member 22 can be designed and wired according to actual needs, which will not be limited specifically herein. In the present embodiment, for example, the first chip 71, the second chip 72, and the third chip 73 can each include two switches connected in series as shown in FIG. 27a, and the three half-bridge circuits are connected in parallel to form a three-phase half-bridge circuit.

Figure 13:
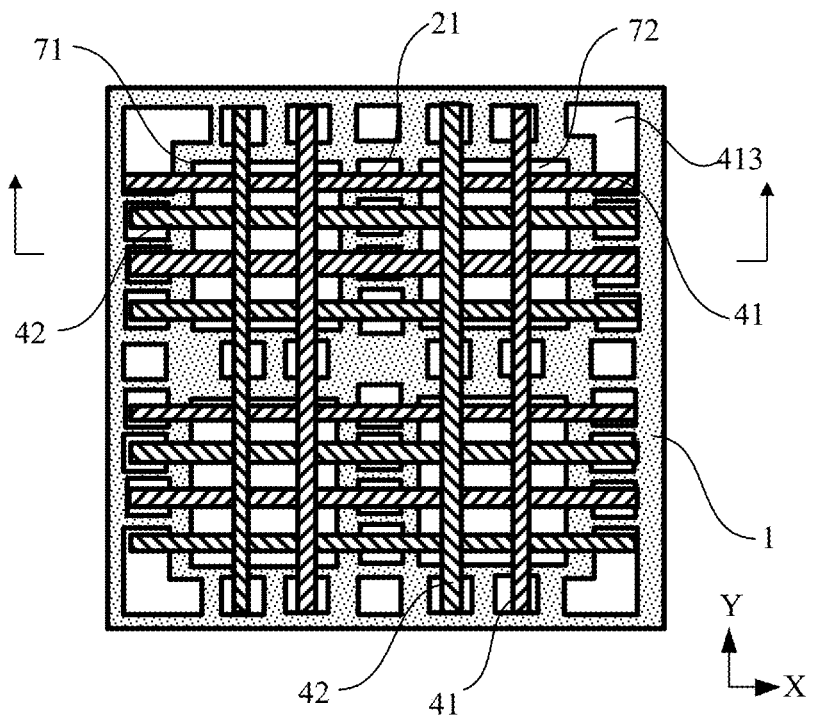
FIG. 13 is a schematic structural diagram of yet another multi-chip package power module according to an embodiment of the present disclosure, in which four chips are arranged in a matrix in the X direction and in the Y direction perpendicular to the X direction in the figure.
Figure 14:
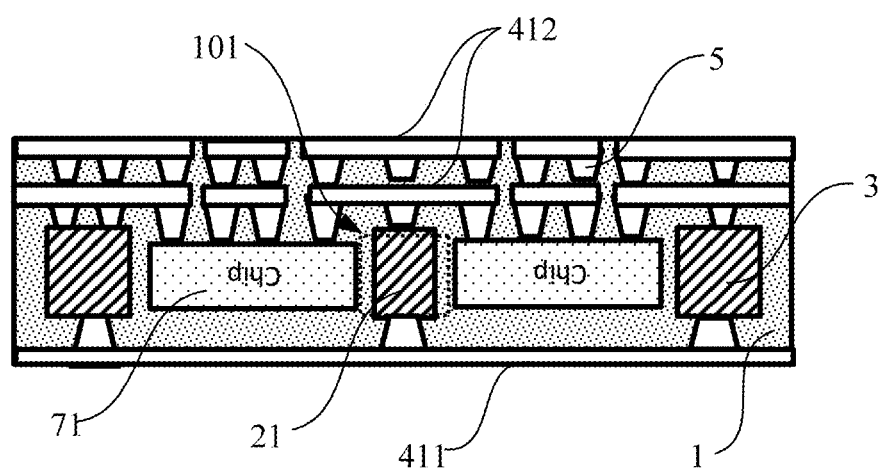
FIG. 14 is a cross-sectional view of FIG. 13.

FIG. 13 is a schematic structural diagram of yet another multi-chip package power module, in which four chips are arranged in a matrix in the X direction and in the Y direction perpendicular to the X direction in the figure, and FIG. 14 is a cross-sectional view of FIG. 13. As shown in FIG. 13, multiple first conductive members 21 and second conductive members 22 are alternately arranged in the envelope region 101 between two adjacent chips in the X direction. Of course, in other examples, one first conductive member 21 and one second conductive member 22 can also be arranged in two adjacent envelope regions 101.

Continue to refer to FIG. 13 and FIG. 14, in the present example, the conductive members with the same electrical characteristics in different envelope regions can be electrically connected through two layers of electrical connection lines arranged at the staggered layer, that is, the conductive members (for example, the first conductive member 21) with the same electrical characteristics between the two adjacent chips in the first row, between the two adjacent chips in the second row, between the two adjacent chips in the first column and between the two adjacent chips in the second column are electrically connected. In the present embodiment, the two layers of conductive lines (the first conductive line 41 or the second conductive line 42) with the same hatching filling patterns are short-circuited with each other, and the two layers of conductive lines (the first conductive line 41 and the second conductive line 42) with different hatching filling patterns are electrically insulated with each other. Assuming that the conductive members with different electrical characteristics are the input ends Vin and GND shown in FIG. 27a, respectively, such arrangement, compared with the package module shown in FIG. 11, the input circuits between the four chips have a better mutual symmetry, that is, the circuits between any two chips can be symmetrical. This structure can improve the current sharing effect of input current among multiple chips, improve the effect of ripple cancellation and the like, and can further reduce the ripple and loss of the input loop. Of course, it is also beneficial for the conductive body (for example, the conductive frame or lead frame) around the chip to connect to the electrical connection line to realize the shunt of the input or output current of each chip, reduce the impedance and improve the output current density.

It should be understood that although the chips shown in FIG. 13 and FIG. 14 are arranged in a matrix of 2 rows and 2 columns, in some other examples, the number of chips along the X direction can be 2 or more, and the number of chips along the Y direction can be 2 or more, for example, a matrix of m rows and n columns can be formed. Of course, the number of chips along the X-axis direction is designed to be two, which helps to form a symmetrical circuit structure. In addition, the first conductive line 41 electrically connected to the first conductive member 21 includes two layers of first connection lines 412, and the second conductive line 42 electrically connected to the second conductive member 22 includes two layers of second connection lines 422. However, it can also be designed according to actual needs. For example, in case of being separated, it can be arranged at the same layer without necessarily being arranged at the staggered layer.

It should be emphasized herein that although the circuit in FIG. 27a is taken as an example in the above examples, that is, it is assumed that the first conductive member 21 and the second conductive member 22 are respectively electrically connected to Vin and GND of the chip. However, in other examples, the first conductive member 21 and the second conductive member 22 with different electrical characteristics can be other power electrodes with different electrical characteristics, such as SW1 and SW2 respectively connected to the two circuits shown in FIG. 27a, or can refer to SW1 and SW2 in the circuit shown in FIG. 9.

Figure 15:
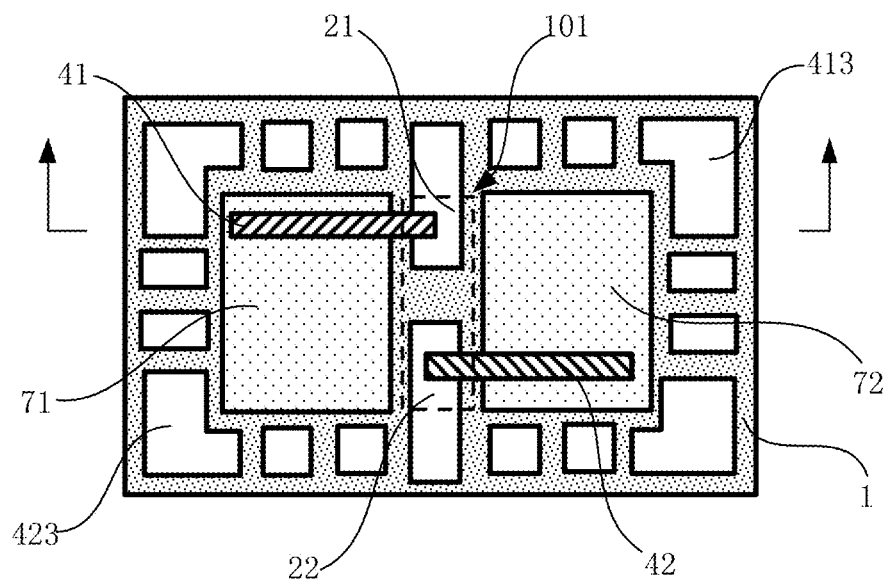
FIG. 15 is a schematic structural diagram of yet another multi-chip package power module according to an embodiment of the present disclosure.

FIG. 15 is a schematic structural diagram of yet another multi-chip package power module. As shown in FIG. 15, the first conductive member 21 and the second conductive member 22 are respectively electrically connected to the SW electrodes of the first chip 71 and the second chip 72. For example, it is assumed that the first connection line 412 of the first conductive line 41 is electrically connected to the SW1 pin of the first chip 71, and the second connection line 422 of the second conductive line 42 is electrically connected to the SW2 pin of the second chip 72. The first connection line 412 is electrically connected to the first conductive member 21, and the second connection line 422 is electrically connected to the second conductive member 22. Both the first conductive member 21 and the second conductive member 22 are at least partially located in the envelope region 101 between the first chip 71 and the second chip 72.

Figure 16:
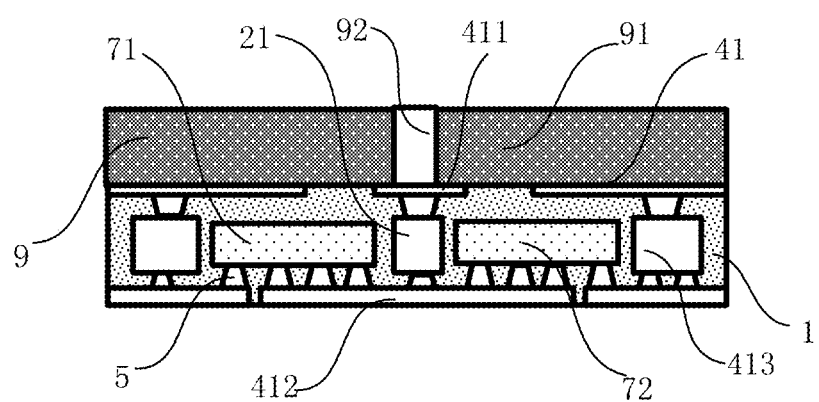
FIG. 16 adds an inductor on the basis of the cross-sectional view of FIG. 15.

FIG. 16 adds an inductor 9 on the basis of the cross-sectional view of FIG. 15. As shown in FIG. 16, the magnetic core 91 of the inductor 9 can be stacked on the first conductive line 41 or on the insulating package material 1, and of course, other materials or devices can be arranged between the magnetic core 91 and the package structure. The winding 92 of the inductor 9 passes through the magnetic core 91 in the vertical direction in FIG. 16, and can pass through the magnetic core 91 horizontally as will be described later in practical application. Of course, the winding 92 can also be of other structural forms.

Continue to refer to FIG. 16, the inductor 9 includes two windings 92, one end of one winding 92 is electrically connected to the first conductive line 41, for example, one end of one winding 92 is electrically connected to the first lead 411, one end of the other winding 92 is electrically connected to the second conductive line 42, for example, the other winding 92 is electrically connected to the second lead 421. The other end of the two windings 92, that is, the end above the winding 92 in FIG. 16 can be the output pin of the entire module. For example, in some examples, a load consuming electrical power can be directly connected the top of inductor 9 to reduce the impedance of the output loop and improve the efficiency. Of course, the output capacitor 8 can also be connected above the inductor 9, or be connected below the chip through other loops to form external pins on the bottom surface for the entire module. In some examples, the inductor 9 can be packaged together with the package module or directly made in the package module. In addition, the two paths of the inductor 9 can be integrated together to form a coupling inductor, such as a positive coupling inductor or a negative coupling inductor, thereby reducing the volume or improving other performances, such as input ripple or dynamics. The leads under the chip can form external pins of the module or be electrically connected to external pins of the module. The power supply module of the above example has compact structure, small footprint and high power density, and the power current mainly flows in the vertical direction of the conductive member, with short current path, small impedance, good heat dissipation and high efficiency.

Figure 17A:
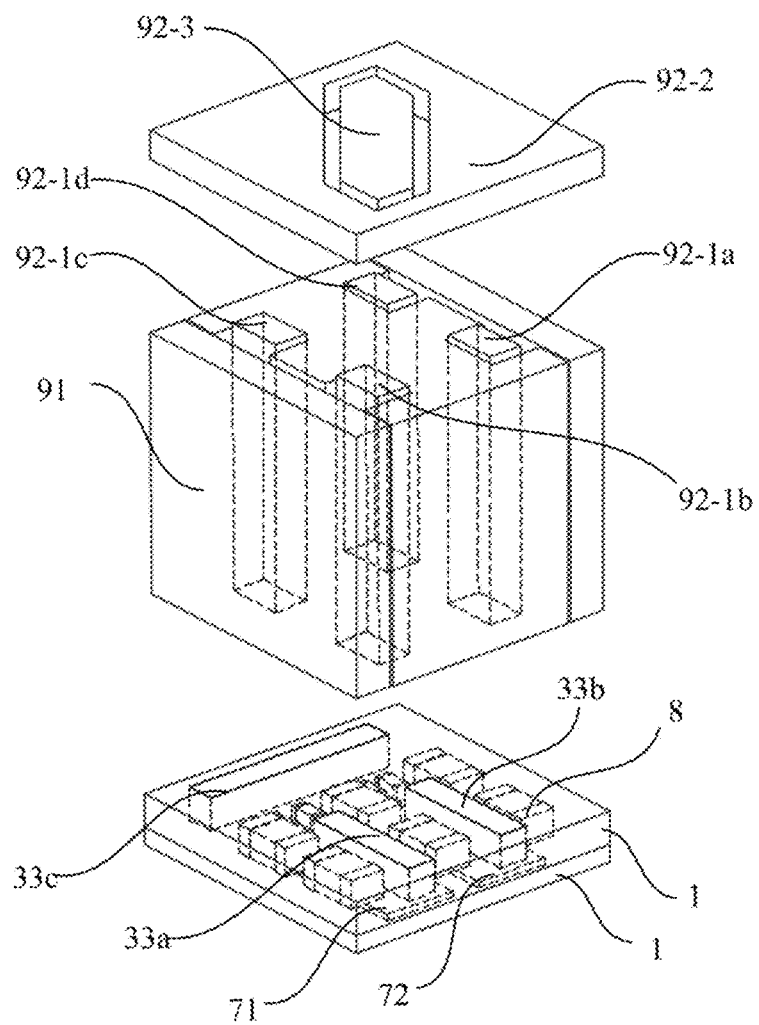
FIG. 17a is a schematic structural diagram of yet another multi-chip package power module according to an embodiment of the present disclosure.

FIG. 17a is a schematic structural diagram of yet another multi-chip package power module. As shown in FIG. 17a, the package module at the bottom can be selected from any of the above examples. Please refer to the above examples for details, which will not be repeated herein. Assuming that the package module at the bottom in FIG. 17a is the package module shown in FIG. 5 and FIG. 7, the copper blocks 33a and 33b can be respectively arranged at the positions of the first pad 61 and the second pad 62 shown in FIG. 5 and FIG. 7, and respectively electrically connected to the SW1 pin of the first chip 71 and the SW2 pin of the second chip 72. Multiple input capacitors 8 might be also arranged on the conductive lines (the first conductive line 41 and the second conductive line 42) of FIG. 5 and FIG. 7, the pins of which are respectively electrically connected to the first connection line 412 and the second connection line 422 in FIG. 5 and FIG. 7. The inductor 9 on the top of FIG. 17 includes a magnetic core 91, four windings 92-1a, 92-1b, 92-1c, 92-1d in four windows of the magnetic core 91, and windings 92-2 and 92-3 on the top. Where the winding 92-1a is electrically connected to the copper block 33a, the winding 92-1b is electrically connected to the copper block 33b, the winding 92-2 short-circuits the winding 92-1a and the winding 92-1c, and the winding 92-3 short-circuits the winding 92-1b and the winding 92-1d. In some examples, the winding 92-1c and the winding 92-1d are both electrically connected to the copper block 33c, the copper block 33c can be electrically connected to the output pad 63 shown in FIG. 5, the output pad 63 shown in FIG. 5 and the output pad 63 shown in FIG. 6 are the same electrode pads in short-circuit connection, forming the output end Vo of the module. Of course, the winding 92-1a in FIG. 17 can be directly electrically connected to the first pad 61 shown in FIG. 5 or FIG. 7, and the winding 92-1b can be directly electrically connected to the second pad 62 shown in FIG. 5 or FIG. 7, eliminating the copper blocks 33a and 33b therein. Similarly, the windings 92-1c and 92-1d can be directly electrically connected to the output pad 63 shown in FIG. 5 or FIG. 7, eliminating the copper block 33c. The present example implements a complete power supply module based on the structures shown in FIG. 4 to FIG. 7, and the adoption of the first conductive member 21 and the second conductive member 22 described above can reduce the ripple of the input loop, improve the filtering effect of the input capacitor 8 and the ripple cancellation and the current sharing effect of the two-phase circuit. Under the condition of the same ripple effect, the demand for capacitor can be reduced. At the same time, the SW end is led out interiorly from the top of the chip, and is electrically connected to the windings 92-1a and 92-1b of the inductor 9, directly and upward, and then the output current is led out on the same side of the module through the windings 92-1c and 92-1d. The stacked power supply module is realized, the power density is high, the vertical conductive path enables better heat dissipation, and current output on the same side improves the convenience for customer application and reduces power loss of the customer mainboard. For example, the inductor 9 is an anti-coupling inductor 9 with two phases being output on the same side of the module. Better dynamic characteristics can also be realized. In a word, most of the power current of the entire module flows in the vertical direction, the current path is short, the impedance is small, the upward and downward heat dissipation is good, the transmission loss is small, the entire structure is compact, the power density is high, and customer application is convenient.

Figure 17B:
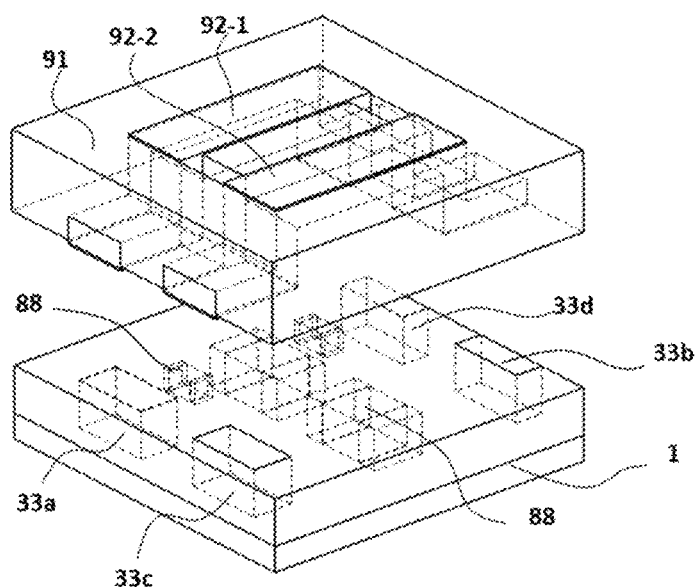
FIG. 17b is a schematic structural diagram of yet another multi-chip package power module according to an embodiment of the present disclosure.

FIG. 17b is a schematic structural diagram of yet another multi-chip package power module. Different from FIG. 17a, the two windings 92-1 and 92-2 of the coupling inductor 9 both adopt a winding shaped like a Chinese character "几" and are combined to a magnetic core 91 shaped like a Chinese character "日" (or shaped like a figure 8). The copper blocks 33a and 33b are electrically connected to the SW1 pin of the first chip 71 and the SW2 pin of the second chip 72 respectively, and are electrically connected to one end of the windings 92-1 and 92-2 respectively; and the copper blocks 33c and 33d are electrically connected to the other end of the windings 92-1 and 92-2 respectively. The output end of the power supply module is formed, for example, being connected to the lower surface of the insulating package material 1 through a via to form an external output pad. In the present embodiment, the two-phase parallel power supply module forms two output ends through the copper blocks 33c and 33d. Of course, the copper block 33c in FIG. 17a can also be divided into two copper blocks to form two parallel external output ends. In addition, other devices, such as a device 88 including a capacitor or a resistor and so on, can be arranged beside the copper block, and the device 88 and the copper block can be packaged into a whole through the insulating package material, with compact structure, high reliability, and beautiful appearance.

Figure 18:
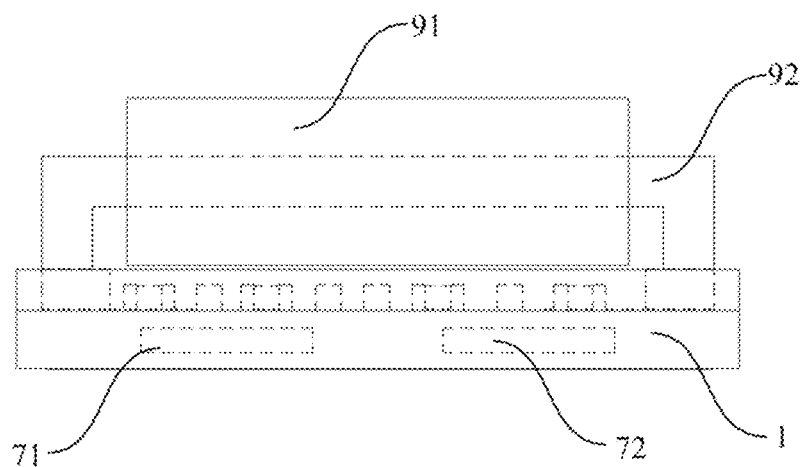
FIG. 18 is a schematic structural diagram of yet another multi-chip package power module according to an embodiment of the present disclosure.

FIG. 18 is a schematic structural diagram of yet another multi-chip package power module. As shown in FIG. 18, different from FIG. 16, the winding 92 of the inductor 9 is horizontally arranged in the magnetic core 91. Specifically, both ends of the winding 92 form a pad downward to electrically connect to the corresponding end in the chip. For example, in the case where there are two switches connected in series in each chip, one end of the winding is electrically connected to the SW pin of the chip. Referring to FIG. 5 and FIG. 7, the first pad 61 or the second pad 62 can be electrically connected through a conductive layer or a copper block on the insulating package material 1. In addition, it can also connect the inductor 9 to the package module through a copper block or a lead frame, which is convenient to arrange other devices between the inductor 9 and the package module. The two phases of the inductor 9 can also be integrated as a positive coupling inductor or a negative coupling inductor. Refer to the above examples for other variations, which will not be repeated herein.

It should be noted that the copper blocks in the above embodiments can be eliminated in some embodiments, for example, the winding of the inductor can be electrically connected to the SW end of the corresponding chip and the output end of the power supply module respectively and directly. The various embodiments described above show that the multi-chip package structure of the present disclosure can realize various power supply modules and have flexible application. The multi-chip package power modules shown in FIG. 16, FIG. 17a, FIG. 17b and FIG. 18 can all lead out external output ends on the top or at the bottom, and the various multi-chip package power modules described later are similar, which will not be repeated.

Figure 19:
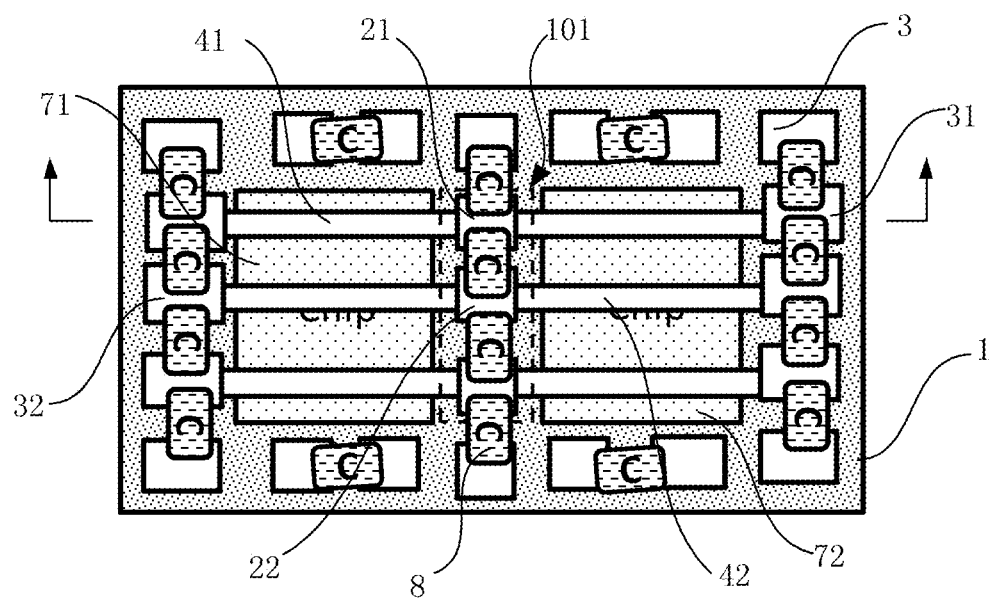
FIG. 19 is a schematic structural diagram of yet another multi-chip package power module according to an embodiment of the present disclosure.
Figure 20A:
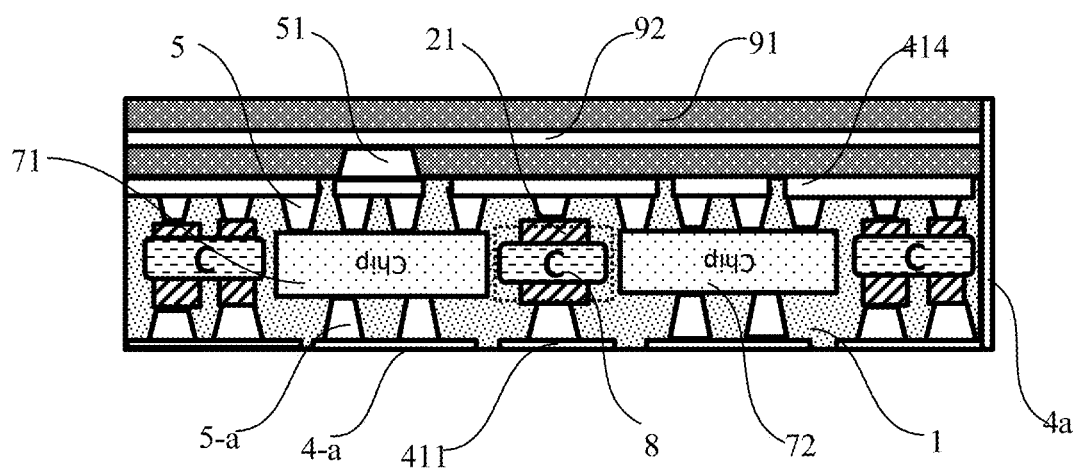
FIG. 20a adds an inductor of a horizontal structure on the basis of the cross-sectional view of FIG. 19.

FIG. 19 is a schematic structural diagram of yet another multi-chip package power module, FIG. 20a adds an inductor 9 on the basis of the cross-sectional view of FIG. 19. As shown in FIG. 20a, a capacitor 8 is arranged in the envelope region 101 between two adjacent chips, for example as an input capacitor. Further referring to FIG. 19 and FIG. 20a, the two electrodes of the capacitor 8 are electrically connected to the first conductive member 21 and the second conductive member 22 respectively. The input capacitor arranged in this way greatly shortens the circuit path from the input capacitor to the input end of the package module and to the two chips, and further enhance the effects of efficiency, current sharing and ripple cancellation. Compared with some of the above examples (for example, FIG. 8), the capacitor 8 is not arranged above the package module, and the inductor 9 can be directly combined with the package module, so that the structure of the power supply module is more compact.

Optionally, other capacitors 8 can be arranged at the periphery of the chip (i.e., near the edge of the package module), and these capacitors 8 can be the input capacitor Cin or the output capacitor Co, referring to FIG. 27a.

Continue to refer to FIG. 20a, the pins of the first chip 71 are arranged upward, and the first pad 61 and the second pad 62 can be led out on the top as shown from FIG. 4 to FIG. 7. In FIG. 20a, the first pad 61 of the first chip 71 is electrically connected to one winding 92 of the inductor 9 through the conductive via 5, and the other end of the winding 92 is connected to the pad on the lower surface of the package module through the conductive connector 4a to form an output end of the module. The conductive connector 4a can be a metallization layer or a metal via at the end of the module or a "stamp hole" structure having a continuous plurality of semicircular holes. The pins of the entire power module can also be arranged on the top of the inductor, for example through the semicircular holes. The second chip 72 can also form a conductive connector structure similar to the first chip 71. In the present example, the two phases of the inductor 9 are optionally integrated together to form a positive coupling inductor or a negative coupling inductor. In addition, for a planar device, a metallization layer can be formed on the back of the chip (surface without pins), which is connected to the conductive line 4-a through the conductive via 5-a to form a downward heat transmission path. For a chip with pins on both sides (such as a vertical device), the conductive via 5-a and conductive line 4-a can also be used for connecting the conductive ends on this side of the chip 71 or 72.

Figure 27B:
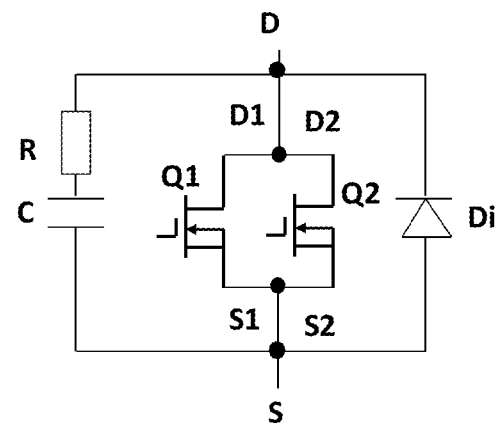
Figure 27C:
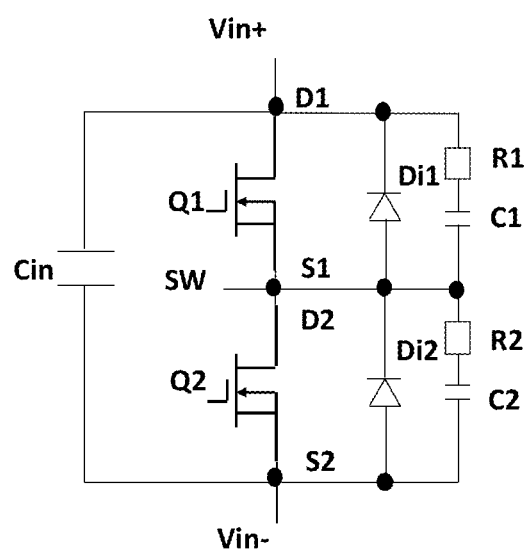
Figure 27D:
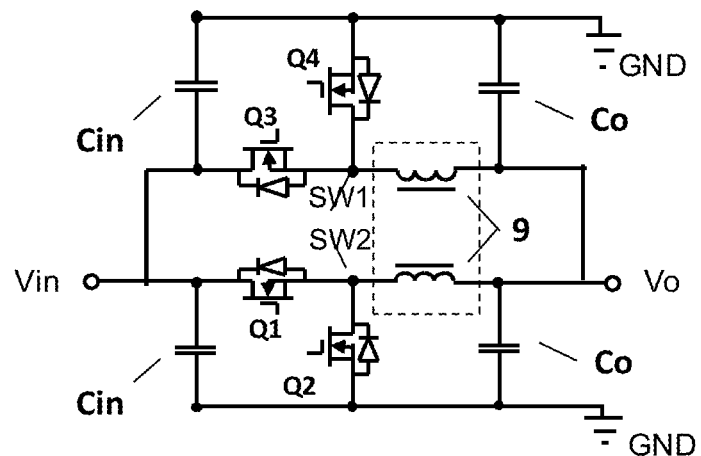

Taking the circuit shown in FIG. 27d as an example, assuming that the winding 92-1 is electrically connected to the first pad 61 (SW end) of the chip 71, the 92-1 is electrically connected to another winding 92-2 through a conductive connection, and the winding 92-2 is connected to an output capacitor (Co in FIG. 27d) to form an output of the entire power supply module (Vo end in FIG. 27d). Arranging the winding 92-1 in this way is beneficial for the heat dissipation from the top surface of the power supply module for the chip 71. Similarly, the other chip 72 can also be electrically connected to the other winding 92 of the inductor 9 (not shown in the figure). The capacitor 8 can be used as an input capacitor (Cin in FIG. 27d).

In the above example, when the two-phase half-bridge circuit operates in parallel, its current sharing effect and ripple cancellation effect are further enhanced, which is helpful to reduce the demand for quantity or capacity of capacitors 8 and improve structure compactness and heat dissipation effect, and the entire power supply module can be manufactured in a contiguous manner to improve the production efficiency and reduce the cost.

Figure 20B:
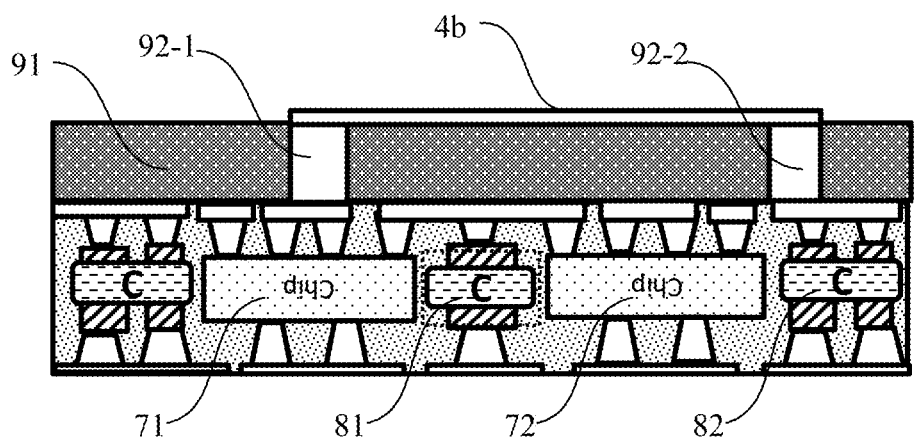
FIG. 20b adds an inductor of a vertical structure on the basis of the cross-sectional view of FIG. 19.

FIG. 20b adds an inductor 9 of a vertical structure on the basis of the cross-sectional view of FIG. 19. As shown in FIG. 20b, compared with the original FIG. 20a, the winding 92-1 of the inductor 9 on the top is arranged in a vertical state. Assuming that FIG. 20b adopts the circuit of FIG. 27d, if the winding 92-1 is electrically connected to the first pad 61 (SW end) of the chip 71, the 92-1 is electrically connected to the other winding 92-2 through the conductive connection 4b, and the winding 92-2 forms the output of the entire power supply module (i.e., Vo end in FIG. 27d) after connecting the output capacitor (i.e., Co in FIG. 27d). Arranging the winding 92-1 in this way is beneficial for the heat dissipation from the top surface of the power supply module for the chip 71. Similarly, the other chip 72 can also be electrically connected to the other winding 92 of the inductor 9 (not shown in the figure). The capacitor 8 can be used as an input capacitor (i.e., Cin in FIG. 27d). The output pin of the entire power supply module might be arranged on top side (or on inductors side) in some applications. Facilitating the output power connection and heat dissipation of the chips.

Figure 21A:
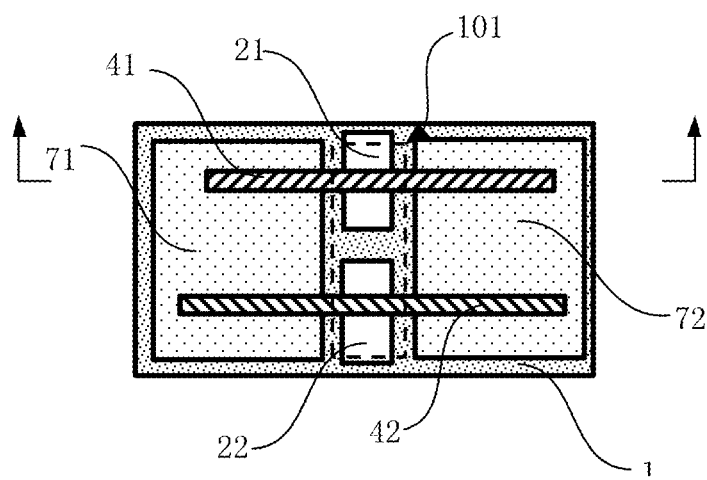
FIG. 21a is a schematic structural diagram of yet another multi-chip package power module.
Figure 22:
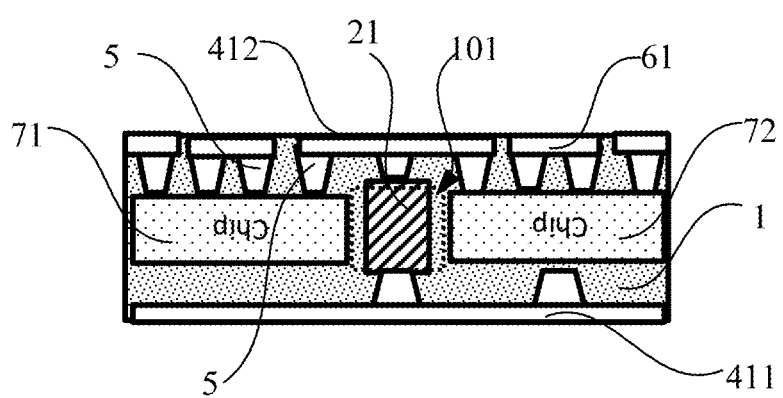

FIG. 21a is a schematic structural diagram of yet another multi-chip package power module, and FIG. 22 is a cross-sectional view of FIG. 21a. The envelope region 101 between the first chip 71 and the second chip 72 is arranged with the first conductive members 21 and the second conductive members 22 that have different electrical characteristics. The first conductive member 21 and the second conductive member 22 are respectively electrically connected to both chips through the first connection line 412 and the second connection line 422, and are integrally packaged in the insulating package material 1.

Figure 23:
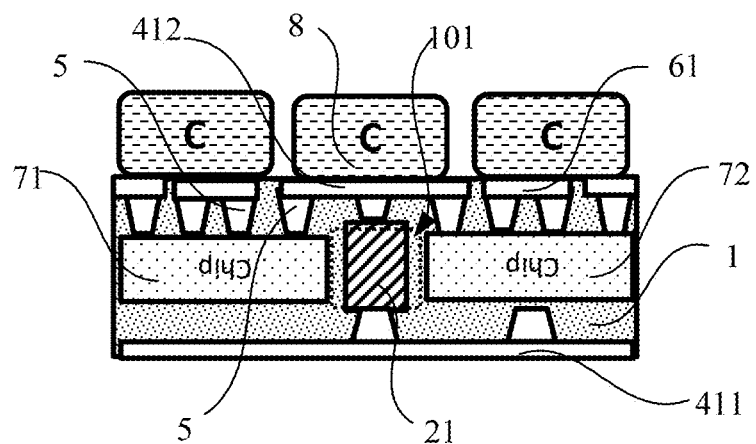
FIG. 23 adds a capacitor on the basis of FIG. 22.

In the present example, there is at least one switch in the first chip 71 or in the second chip 72. Taking the case that there is one switch in each chip as an example, the two switches can be connected in parallel or in series. Referring to FIG. 27b, assuming that the two chips are connected in parallel, and then there are only two power electrodes D and S in the present circuit. In order to reduce the di/dt, dv/dt or instantaneous power consumption on the switch, a buffer circuit is usually connected in parallel to the two power pins of the switch to transfer the power consumption of the switch to the relevant resistor for consumption, thereby ensuring the safety of the device. For example, FIG. 27b shows an RC buffer circuit, and the parasitic inductance of the loop formed by the buffer circuit and the switch has a great influence on the buffer effect, so that a smaller the parasitic inductance is required. If the power supply module of FIG. 21a and FIG. 22 is applied, the RC circuit is connected to the first conductive member 21 and the second conductive member 22, and is stacked with the first chip 71 and the second chip 72, and with the first conductive member 21 and the second conductive member 22. The capacitor 8 can be added on the basis of FIG. 22, as shown in FIG. 23, which can omit the resistor R in some cases. The above power supply module can reduce the loop from capacitor to two chip connection circuits and reduce the parasitic inductance. At the same time, the loop between the capacitor and the two chips is symmetrical, which facilitates improvement of the overall buffer effect.

Figure 21B:
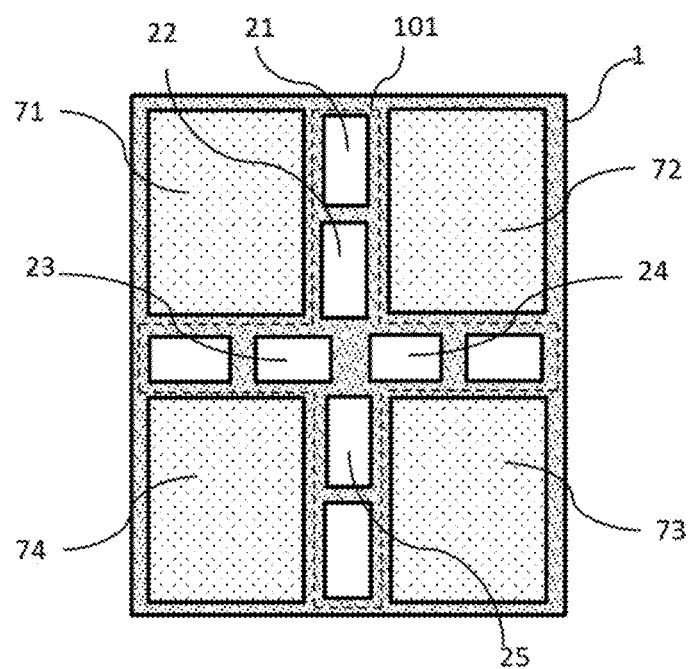
FIG. 21b is a schematic structural diagram of yet another multi-chip package power module.

FIG. 21b is a schematic structural diagram of yet another multi-chip package power module, in which connection lines are omitted. The difference between FIG. 21b and FIG. 21a is that the chips in the multi-chip package power module are arranged in a matrix. Specifically, as shown in FIG. 21b, the four chips 71, 72, 73 and 74 are arranged in two rows and two columns, and a cross-shaped envelope region 101 illustrated by dashed lines is formed among the four chips, and the first conductive member 21 and the second conductive member 22 are arranged within this envelope region 101. Of course, other conductive members can also be arranged, such as conductive members 23, 24 and 25 as shown in the figure. It should be noted that each of the conductive members 22, 23, 24 and 25 can have different electrical characteristics, or some or all of them can have the same electrical characteristics; if there are multiple conductive members having the same electrical characteristics, the conductive members having the same electrical characteristics can be electrically connected to each other or be directly and integrally molded to form an integral conductive member. For example, when the conductive members 22, 23, 24, and 25 all have the same electrical characteristics, the four conductive members can be integrated into one piece conductive member; as shown schematically in FIG. 21b, a cross-shaped conductive member can be formed, which facilitates the improvement of the structural strength.

In addition, in the present example, the package module realizes three-dimensional stacking, which can reduce the footprint of the power supply module and improve the power density. Moreover, the above power supply module does not need to arrange a conductive body around the chip, for example, a lead frame is not necessarily arranged around the chip, but only a conductive member is arranged in the envelope region 101 between the two chips, such as the first conductive member 21 and the second conductive member 22 in FIG. 21a, or the conductive members 21 to 25 in FIG. 21b; the conductive member arranged between the chips can realize the electrical connection between the top and bottom of the chips, with path symmetrical structure for each chip. Such structure can not only reduce the footprint of the package structure, but also realize the circuit stacked structure, further simplifying the structure and increasing the power density. Of course, according to the actual application, the conductive body can also be arranged around or on one side of the package module.

Figure 24:
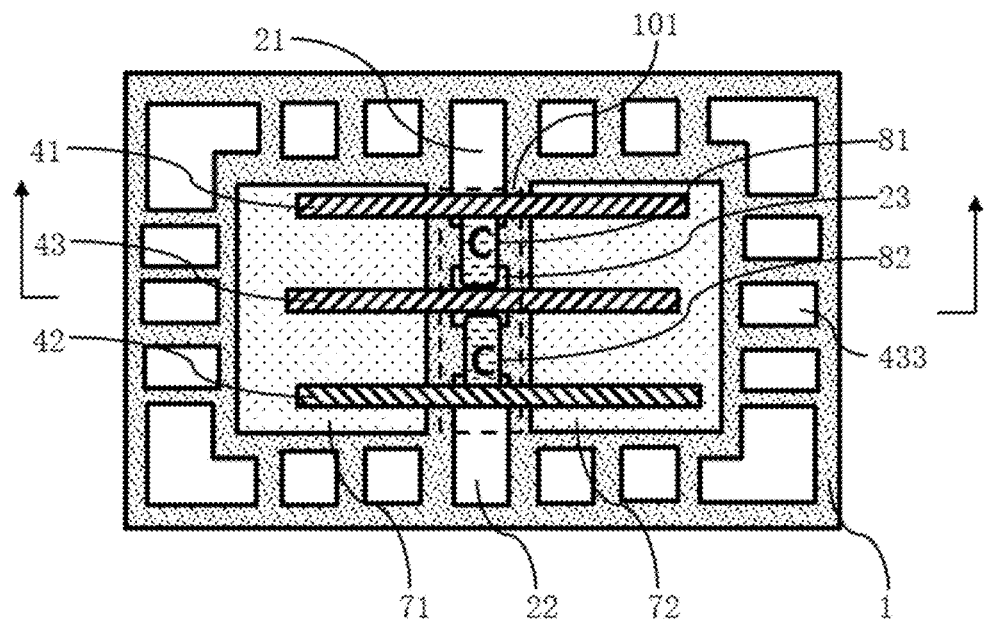
FIG. 24 is a schematic structural diagram of yet another multi-chip package power module according to an embodiment of the present disclosure.
Figure 25:
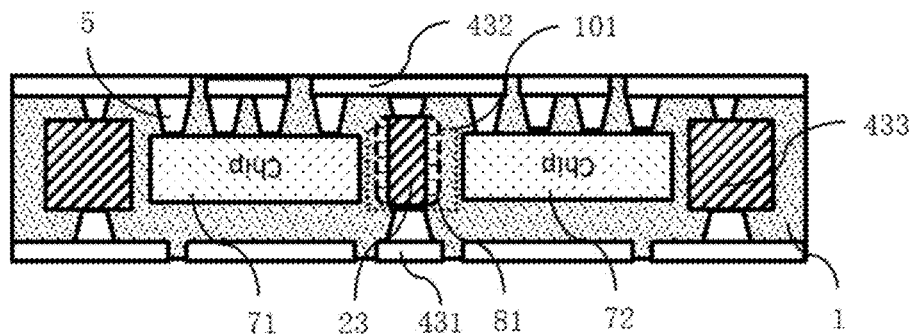
FIG. 25 is a cross-sectional view of FIG. 24.
Figure 26:
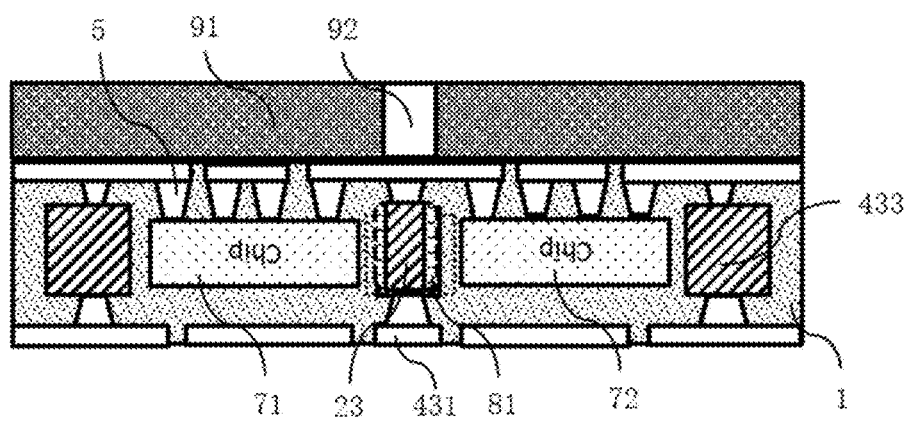
FIG. 26 adds an inductor on the basis of FIG. 25.

FIG. 24 is a schematic structural diagram of yet another multi-chip package power module, FIG. 25 is a cross-sectional view of FIG. 24, and FIG. 26 adds an inductor 9 on the basis of FIG. 25. Taking the circuit shown in FIG. 27c as an example, assuming that two chips are connected in series, the circuit has three power electrodes, Vin+, SW and Vin+ (or called GND). The SW in this circuit is electrically connected to both chips. Similarly, each switch (such as Q1 or Q2 in FIG. 27b) can be connected in parallel to the corresponding buffer circuit, for example, Q1 corresponds to R1 and C1, and Q2 corresponds to R2 and C2. Referring to the previous description for details which will not be repeated herein.

Specifically, the envelope region 101 arranged between the chips has the first conductive members 21 and the second conductive members 22, which are electrically connected to the two chips respectively through the first conductive line 41 and the second conductive line 42. Assuming that the third conductive line 43 is electrically connected to SW in FIG. 27a, the first conductive member 21 is electrically connected to the D1 end of chip Q1 in FIG. 27c (i.e., is electrically connected to Vin), and the second conductive member 22 is electrically connected to Vin−. Where Q1 is the first chip 71 in FIG. 24 and Q2 is the second chip 72. Similar to the first conductive line 41 and the second conductive line 42, the third conductive line can also include the third lead 431, the fifth connection line 432, and the third conductive body 433 shown in FIG. 25.

It should be noted that although the first conductive line 41 in FIG. 24 also extends to the top of the second chip 72, it does not mean that the first conductive line 41 must be electrically connected to the second chip 72, and it can be used to electrically connect to other devices between the third conductive line 43, such as a capacitor 8 or an external diode. Similarly, the second conductive line extending to the top of the first chip 71 does not mean that the second conductive line must be electrically connected to the first chip 71.

Taking the one-phase buck circuit shown in FIG. 27a as an example for description. As shown in FIG. 25, assuming that the third conductive line 43 is connected to the SW end in FIG. 27d, the third conductive line 43 does not have to lead downward. Thus the capacitors 81 and 82 can be arranged in the envelope region 101 between the two chips, for example, as the input capacitor Cin in FIG. 27a. In some implementations, the third conductive member 23 can also be arranged below the third conductive line 43 as shown in FIG. 24, and the third conductive line 43 is electrically connected to the third conductive member 23. Referring to the circuit shown in FIG. 27c, assuming that the embedded capacitors 81 and 82 in FIG. 24 or FIG. 25 are buffer capacitors C1 and C2 respectively, that is, the capacitor 81 is arranged as a capacitor C1 between the first conductive member 21 and the second conductive member 22, and a capacitor C2 is arranged between the second conductive member 22 and the third conductive member 23. The electrode of the capacitor C1 is electrically connected to the first conductive member 21 and the second conductive member 22 respectively, the electrode of the capacitor C2 is electrically connected to the second conductive member 22 and the third conductive member 23 respectively, and the embedded capacitor can make the structure compact, reduce the parasitic inductance and improve the buffer effect. Of course, the capacitors Cin and Co can be simultaneously embedded in the envelope region 101 between the chips in the manner shown in FIG. 24. In some implementations, the first conductive member 21, the second conductive member 22, or the third conductive member 23 can be replaced by an electrode end of the capacitor 81 or the capacitor 82.

Further, on the basis of FIG. 25, the third conductive line 43 can be electrically connected externally as a pad, for example, as the SW end so as to be connected to the output inductor 9, thereby obtaining the structure shown in FIG. 26. Referring to FIG. 26, the winding 92 of the output inductor 9 is electrically connected to the third conductive line 43. Through the above arrangement, the stacking arrangement of the output inductor 9 and the chip can be realized, and the circuit path between SW and the two chips is symmetrical, which not only helps to improve overall efficiency, but also helps to improve the power density. In addition, the input capacitor Cin can be embedded in the envelope region 101 between the chips. In some embodiments, the buffer capacitor can also be arranged simultaneously as shown in FIG. 27c, referring to FIG. 24, the capacitor 81 embedded in the envelope region 101 between the chips can be used as the capacitor C1 in FIG. 27c, and the capacitor 82 can be used as the capacitor C2 in FIG. 27c to reduce the parasitic inductance of the buffer circuit, and the symmetrical loop helps to improve the buffer effect, the safety of the switch and the system efficiency.

In the above examples, for some chips (for example, chip with SiC MOS tube), the schottky diode can be externally connected to reduce the conduction loss and improve the reverse recovery speed. Such as the external reverse diode Di shown in FIG. 27b and FIG. 21c, the package structures of the above examples can also reduce the parasitic inductance of the external reverse diode.

It should also be noted that the inductor 9 of the power supply module in some of the above examples can be packaged with the package module, of course, the inductor 9 and the capacitor 8 can also be packaged together simultaneously with the package module. At the same time, the package module and the power supply module in the previous examples can be produced in a contiguous manner, which can bring many benefits, such as high precision for each module, good consistency, high production efficiency and low cost.

Figure 27E:
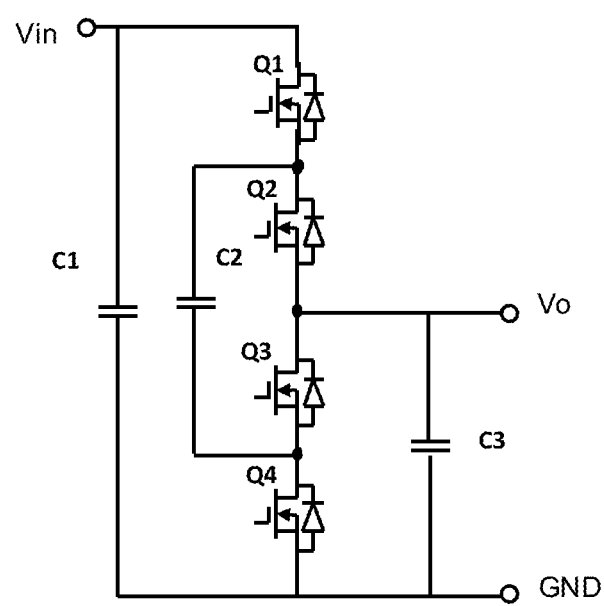
Figure 27F:
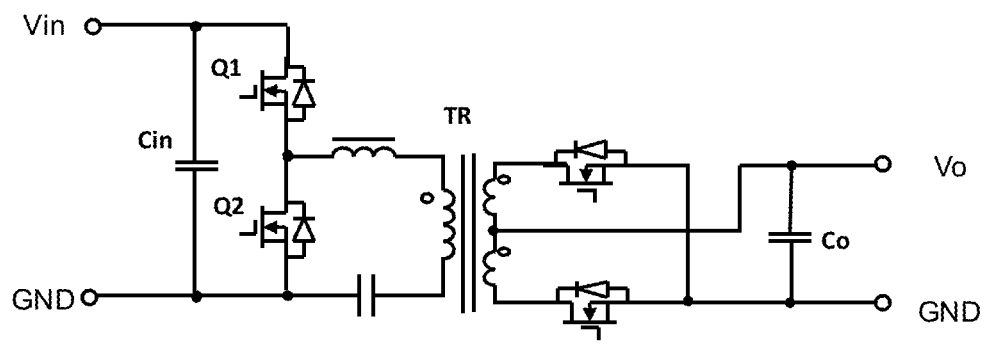
Figure 27G:
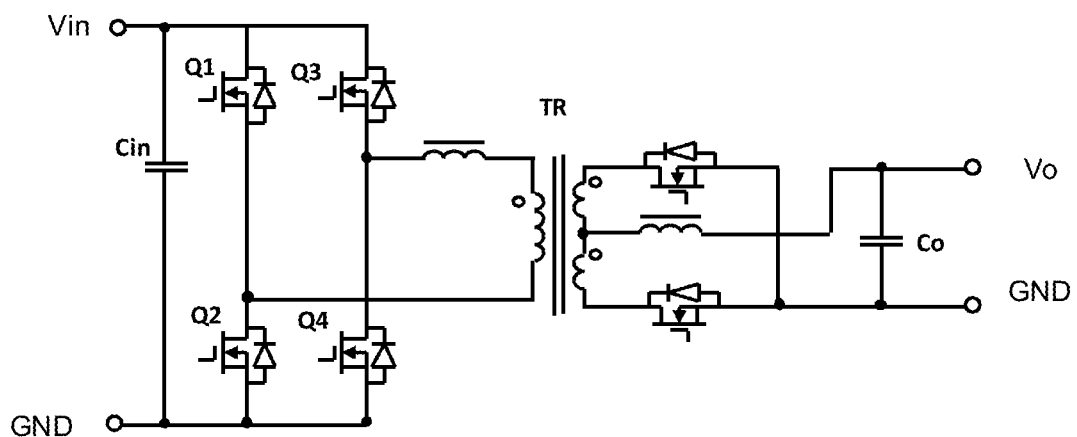

Finally, although several circuits have been described in connection with the structure in the above examples, the above examples are not limited to the circuits described above, any circuit in FIG. 27 can be applied, and of course other suitable circuits can also be applied. In order to deepen the understanding, each circuit in FIG. 27 will be briefly described below:

FIG. 27a is a buck circuit. FIG. 27b is a parallel circuit of two switches with a buffer circuit and an external diode Di. FIG. 27c is a series circuit of two switches, and each switches is arranged with a buffer circuit and an external diode. FIG. 27d is a two-phase buck parallel circuit. FIG. 27e is a switching capacitor circuit. FIG. 27f is an LLC circuit. FIG. 27g is a PWM type DC-DC conversion circuit.

In the specific application, assuming that the circuit of FIG. 27e is adopted, if the switches Q1 and Q2 are integrated in one chip (the first chip 71) and the switches Q3 and Q4 are integrated in another chip (the second chip 72), then after the two chips are packaged together in the manner described above, the SW1 end (electrically connected to the third power pin of the first chip 71) and the SW2 end (electrically connected to the third power terminal of the second chip 72) are arranged between the chips, and a smaller loop may be used to connect the capacitor C2. Of course, the Vin end (electrically connected to the first power pin of the first chip 71) and the GND end (electrically connected to the second power pin of the second chip 72) can also be arranged between the chips, and the capacitor C1 may be connected with a smaller loop. Of course, the Vo end (electrically connected to the second power pin of the first chip 71 and to the first power pin of the second chip 72) and the GND end (electrically connected to the second power pin of the second chip 72) can also be arranged between the chips, and a smaller loop may be used to connect the capacitor C 3.

Assuming that the circuit of FIG. 27f is adopted, if the switches Q1 and Q2 in the half-bridge LLC circuit are integrated in two chips respectively and packaged in the above manner, the loop path connecting the input capacitor Cin can be reduced.

Assuming that the circuit of FIG. 27g is adopted, if the switches Q1 and Q2 of the four bridge arm switches (Q1 to Q4) in the full bridge circuit are integrated in one chip (the first chip 71) and the switches Q3 and Q4 are integrated in another chip (the second chip 72), then the two chips are packaged in the manner described above, the first power pin and the second power pin of the first chip 71 and the second chip 72 can be led out between the chips, the first power pin of the first chip 71 is short-circuited with the first power pin of the second chip 72 and electrically connected to Vin, and the second power pin of the first chip 71 is short-circuited with the second power pin of the second chip 72 and electrically connected to the GND of primary side, and the loop path connecting the input capacitor Cin can be reduced. If the SW ends of the first chip 71 and the second chip 72 are arranged between the chips, the resonant inductor and the transformer primary side can be connected in a short path. In some cases, the first power pin or the second power pin and the third power pin in a certain chip can also be arranged at a position between the chips, which helps to reduce the loop path connected in parallel to other switches and expand the current output capability.

Finally, it should be noted that the above embodiments are only used to illustrate the technical solution of the present disclosure, and are not limited thereto; although the present disclosure has been described in detail with reference to the foregoing embodiments, those of ordinary skill in the art will understand that they may modify the technical solutions described in the foregoing embodiments, or may equivalently replace some or all of the technical features; and the modifications or substitutions do not deviate the essence of the corresponding technical solution from the scope of the technical solution of the embodiments of the present disclosure.

What is claimed is:

1. A multi-chip package power module, comprising:
multiple chips, comprising a first chip and a second chip that are arranged adjacently, wherein each of the first chip and the second chip comprises at least one switch;
a first conductive member, at least partially arranged between the first chip and the second chip;
a second conductive member, at least partially arranged between the first chip and the second chip, wherein the first conductive member is electrically connected to a power pin of the first chip, the second conductive member is electrically connected to a power pin of the second chip, and the multiple chips, the first conductive member and the second conductive member are all embedded in an insulating package material;
a first connection line and a second connection line that are arranged on a first side of the first chip and the second chip; and
a first lead and a second lead that are arranged on a second side of the first chip and the second chip, wherein the second side is opposite to the first side;
wherein a first end of the first conductive member is electrically connected to the first connection line, a second end of the first conductive member is electrically connected to the first lead, a first end of the second conductive member is electrically connected to the second connection line, and a second end of the second conductive member is electrically connected to the second lead.

2. The multi-chip package power module of claim 1, wherein the first connection line is electrically connected to a first power pin of the first chip and a first power pin of the second chip, and the second connection line is electrically connected to a second power pin of the first chip and a second power pin of the second chip.

3. The multi-chip package power module of claim 1, further comprising:
a first conductive body and a second conductive body that are both arranged at the periphery of the first chip and the second chip, wherein one end of the first conductive body is electrically connected to the first lead, and one end of the second conductive body is electrically connected to the second lead.

4. The multi-chip package power module of claim 3, wherein the other end of the first conductive body is electrically connected to both a first power pin of the first chip and a first power pin of the second chip; the other end of the second conductive body is electrically connected to both a second power pin of the first chip and a second power pin of the second chip.

5. The multi-chip package power module of claim 4, further comprising: a third connection line and a fourth connection line that are arranged on the first side of the first chip and the second chip, the first conductive body is electrically connected to both the first power pin of the first chip and the first power pin of the second chip through the third connection line, and the second conductive body is electrically connected to both the second power pin of the first chip and the second power pin of the second chip through the fourth connection line.

6. The multi-chip package power module of claim 1, further comprising:
   a first pad arranged on the first side of the first chip, wherein the first pad is electrically connected to a third power pin of the first chip; and
   a second pad arranged on the first side of the second chip, wherein the second pad is electrically connected to a third power pin of the second chip.

7. The multi-chip package power module of claim 6, further comprising:
   an inductor, wherein the inductor comprises a magnetic core and two windings, the first pad and the second pad are respectively electrically connected to one of the two windings, and the inductor is stacked with the chips.

8. The multi-chip package power module of claim 7, wherein the windings horizontally passes through the magnetic core, the first pad is electrically connected to one end of one of the windings, the second pad is electrically connected to one end of the other winding, and the other ends of the two windings are electrically connected to an output pad through an electrical connection part, respectively.

9. The multi-chip package power module of claim 7, wherein the windings vertically passes through the magnetic core and the two windings are electrically connected to the first conductive member and the second conductive member, respectively;
   wherein an output pad of the multi-chip package power module are located on a side of the chip that is close to the inductor or away from the inductor.

10. The multi-chip package power module of claim 7, wherein the windings vertically passes through the magnetic core, each winding comprises two sub-windings, and wire for connecting the two sub-windings are arranged outside the magnetic core.

11. The multi-chip package power module of claim 1, wherein the first chip and the second chip are arranged side by side in a first direction, the first conductive member and the second conductive member are arranged side by side in a second direction perpendicular to the first direction.

12. The multi-chip package power module of claim 11, wherein both the first conductive member and the second conductive member are multiple, and the multiple first conductive members and the multiple second conductive members are alternately arranged in the second direction.

13. The multi-chip package power module of claim 1, wherein the multiple chips are linearly arranged; or
   the multiple chips are arranged in a matrix, and the first connection line and the second connection line are both provided in at least two layers.

14. The multi-chip package power module of claim 1, wherein the multiple chips are all planar type devices;
   wherein the multiple chips adopt embedded package or injection molded package.

15. The multi-chip package power module of claim 1, wherein each of the chips comprises a first switch and a second switch that are connected in series, and each of the chips has a first power pin, a second power pin and a third power pin;
   wherein the first conductive member is electrically connected to the third power pin of the first chip, and the second conductive member is electrically connected to the third power pin of the second chip.

16. The multi-chip package power module of claim 15, further comprising:
   an inductor, wherein the inductor comprises a magnetic core and two windings, the magnetic core is stacked on a second side of both the first chip and the second chip, and the first conductive member and the second conductive member are electrically connected to one of the two windings, respectively;
   wherein the windings passes through the magnetic core horizontally or vertically.

17. The multi-chip package power module of claim 1, wherein the first conductive member is electrically connected to a first power pin of the first chip, and the second conductive member is electrically connected to a second power pin of the second chip;
   wherein the multi-chip package power module further comprises a third conductive member arranged between the first chip and the second chip, and is electrically connected to both a second power pin of the first chip and a first power pin of the second chip.

18. The multi-chip package power module of claim 1, further comprising:
   a capacitor, a first end of the capacitor is electrically connected to the first conductive member, and a second end of the capacitor is electrically connected to the second conductive member;
   wherein the capacitor is arranged on a first side of the chips, and is bridged on the adjacent first and second conductive members; or the capacitor is embedded in the insulating package material between the first chip and the second chip, and is bridged between the adjacent first and second conductive members.

19. The multi-chip package power module of claim 1, wherein the first conductive member and the second conductive member are both formed by metallization;
   wherein the first lead, the first connection line, the second lead and the second connection line are all metal wiring layers formed by metallization.

* * * * *